United States Patent [19]

Yamada et al.

[11] Patent Number: 4,983,489

[45] Date of Patent: Jan. 8, 1991

[54] IMAGE-FORMING METHOD USING SILVER HALIDE AND POLYMERIZABLE COMPOUND WITH DEVELOPMENT INHIBITOR RELEASER

[75] Inventors: Makoto Yamada; Tetsunori Matsushita, both of Kanagawa, Japan

[73] Assignee: Fuji Photo Film Co., Ltd., Kanagawa, Japan

[21] Appl. No.: 329,152

[22] Filed: Mar. 27, 1989

[30] Foreign Application Priority Data

Mar. 25, 1988 [JP] Japan .................................. 63-71247

[51] Int. Cl.$^5$ ........................... G03C 5/54; G03F 7/26
[52] U.S. Cl. .................................... 430/138; 430/203; 430/253; 430/254; 430/264; 430/327; 430/330; 430/617; 430/957
[58] Field of Search ............... 430/138, 203, 617, 957, 430/330, 327, 253, 254, 264

[56] References Cited

U.S. PATENT DOCUMENTS

| | | | |
|---|---|---|---|
| 3,234,021 | 2/1966 | Schwerin et al. | |
| 3,723,120 | 3/1973 | Hummel | 430/327 |
| 4,518,685 | 5/1985 | Yagihara et al. | 430/505 |
| 4,629,676 | 12/1986 | Hayakawa et al. | 430/203 |
| 4,845,018 | 7/1989 | Sato et al. | 430/203 |
| 4,876,170 | 10/1989 | Tamagawa et al. | 430/203 |

FOREIGN PATENT DOCUMENTS

| | | |
|---|---|---|
| 228085 | 7/1987 | European Pat. Off. |
| 1236741 | 4/1970 | Fed. Rep. of Germany |

*Primary Examiner*—Richard L. Schilling
*Attorney, Agent, or Firm*—Sughrue, Mion, Zinn, Macpeak & Seas

[57] ABSTRACT

An image-forming method employs a light-sensitive material comprising a support and a light-sensitive layer provided thereon which contains a silver halide, a reducing agent, an ethylenically unsaturated polymerizable compound and a specific development inhibitor precursor. The image-forming method comprises heat-developing the light-sensitive material after or simultaneously with imagewise exposure of the material so as to imagewise polymerize the polymerizable compound in the presence of a development inhibitor released from the precursor in the course of the heat development. The image-forming method may be also performed under such condition that a liquid such as water is contained in the light-sensitive layer of the light-sensitive material within the specific amount.

7 Claims, No Drawings

IMAGE-FORMING METHOD USING SILVER HALIDE AND POLYMERIZABLE COMPOUND WITH DEVELOPMENT INHIBITOR RELEASER

FIELD OF THE INVENTION

The present invention relates to an image-forming method using a light-sensitive material comprising a support and a light-sensitive layer provided thereon which contains a silver halide, a reducing agent and a polymerizable compound.

BACKGROUND OF THE INVENTION

A light-sensitive material comprising a support and a light-sensitive layer provided thereon which contains a silver halide, a reducing agent and a polymerizable compound can be employed in an image-forming method in which a latent image of the silver halide is formed and the polymerizable compound is polymerized to form a corresponding image.

Examples of the image-forming methods are described in Japanese Patent Publication Nos. 45(1970)-11149, 47(1972)-20741 and 49(1974)-10697, and Japanese Patent Provisional Publication Nos. 57(1982)-138632, 57(1982)-142638, 57(1982)-176033, 57(1982)-211146, 58(1983)-107529, 58(1983)-121031 and 58(1983)-169143. In those methods, during the developing stage of the exposed silver halide with the developing agent, the co-existing polymerizable compound (e.g., vinyl compound) is polymerized to form an imagewise polymer compound. Accordingly, those methods require a developing treatment using a liquid, and the developing treatment also requires a relatively long period of time.

As improved image-forming methods, those using a dry process are described in Japanese Patent Provisional Publications Nos. 60(1985)-69062, 61(1986)-73145, 61(1986)-183640, 61(1986)-188535 and 61(1986)-228441. Those improved methods employ a recording material (i.e., light-sensitive material) comprising a support and a light-sensitive layer provided thereon which contains a light-sensitive silver salt (i.e., silver halide), a reducing agent, a cross-linkable compound (i.e., polymerizable compound) and a binder.

In the above-stated various image-forming methods, the polymerizable compound in an area where a latent image of the silver halide has been formed is polymerized.

Japanese Patent Provisional Publication No. 62(1987)-70836 describes another image-forming method in which the polymerizable compound in an area where a latent image of the silver halide has not been formed is polymerized. In this method, when the light-sensitive material is heated, polymerization of the polymerizable compound in the area where a latent image of the silver halide has been formed is inhibited owing to the function of the reducing agent, and polymerization of the polymerizable compound in other area is accelerated.

As an embodiment of the light-sensitive materials employable in the above various image-forming methods, Japanese Patent Provisional Publications Nos. 61(1986)-275742 and 61(1986)-278849 describe a light-sensitive material using microcapsules which contain components of the light-sensitive layer such as a silver halide and a SO polymerizable compound. The light-sensitive material using such microcapsule (also referred to as "light-sensitive microcapsule") has an advantage of producing an image of high quality, particularly an image of high sharpness.

The development of the light-sensitive material is conducted under heating. However, the light-sensitive material temporarily heated to an elevated temperature requires a long period of time for lowering the temperature of the material, and hence the development is excessively done to deteriorate quality of the resulting image. Further, even in the image-forming method using the same heating process, the procedure of development tends to vary depending on various conditions such as an external temperature, a heating temperature, an amount of water contained in the material and a heating time. 0 For avoiding such unfavorable phenomena, there have been proposed other image-forming methods which are similar to the above-mentioned ones. For example, a method of using an acid polymer for neutralization in a diffusion transferring process is described in Research Disclosure (Volume 123, pp. 22, Volume 180, pp. 18,030) or British Patent No. 2,082,72A, but when this method is applied to the above-mentioned light-sensitive material, for example when a base is employed as a development accelerator, the resulting image is reduced in discrimination because the base is rapidly neutralized. Otherwise, Japanese Patent Provisional Publication Nos. 49(1974)-58642 and 50(1975)-57452 describe acid components dissolved or releasing a volatile acid at a temperature higher than 60° C. as a compound releasing an acid in the heating stage. However, when those compounds are used in the light-sensitive material containing a silver halide, a reducing agent and a polymerizable compound, the base is neutralized prior to initiation of the development under heating to inhibit the development, and thereby the contrast of the resulting image lowers.

There is also known a photographic material which uses a compound having an active group which shows an antifogging function or a development inhibiting function wherein the active group is blocked to obtain an inert compound (i.e., antifogging precursor or development inhibitor precursor). The blocking of the active group of the antifogging agent or the development inhibitor makes it possible not only to restrain adsorption of the active group to the stored light-sensitive silver halide and sensitivity-decreasing function caused by the formation of silver salt but also to release those agents at the desired stage, whereby occurrence of fogging can be reduced without lowering the sensitivity. Further, fogging caused by excessive development can be also avoided, or the development can be terminated at the desired time.

Examples of the methods utilizing the blocking technique include a method using a blocking group such as acyl group and sulfonyl group as described in Japanese Patent Publication No. 47(1972)-44805 (U.S. Pat. No. 3,615,617); a method using a blocking group capable of releasing a development inhibitor through so-called "Reverse Michael Reaction" as described in Japanese Patent Publication Nos. 54(1979)-39727 (U.S. Pat. No. 3,674,478) and 55(1980)-9696 (U.S. Pat. No. 4,009,029); a method using a blocking group releasing a development inhibitor accompanied by production of quinonemethide or its similar compounds by means of electron movement in the molecule as described in Japanese Patent Publication No. 54(1979)-39727 and Japanese Patent Provisional Publication Nos. 57(1982)-135944, 57(1982)-135945 and 57(1982)-136640; a method using a ring-closure, reaction in the molecule as described in Japanese Patent Provisional Publication No. 55(1980)-53330; a method using ring cleavage of 5-members or 6-members as described in Japanese Patent Provisional Publication Nos. 57(1982)-76541 (U.S. Pat. No. 4,335,200), 57(1982)-135949 and 57(1982)-179842; a method using a blocking group releasing a development inhibitor by means of so-called "Michael Reaction" as described in Japanese Patent Provisional Publication Nos. 59(1984)-201057, 61(1986)-43739, 61(1986)-95346 and 61(1986)-95347; and a method using a blocking group releasing a development inhibitor accompanied by developing reaction of silver halide as described in Japanese Patent Provisional Publication Nos. 60(1985)-233648, 61(1986)-156043 and 61(1986)-236549.

SUMMARY OF THE INVENTION

It is an object of the present invention to provide an image-forming method using a light-sensitive material containing a development inhibitor precursor which is improved in storage properties, in which the development of the material can be appropriately terminated.

It is another object of the invention to provide an image-forming method in which images of high quality can be reliably obtained independent of developing conditions such as a developing temperature and a developing time.

It is a further object of the invention to provide an image-forming method in which polymerization reaction of the polymerizable compound can be efficiently accomplished by means of simple operation and an image of high sharpness can be obtained.

There is provided by the present invention an image-forming method which comprises the steps of:

imagewise exposing to light a light-sensitive material comprising a support and a light-sensitive layer provided thereon which contains a silver halide, a reducing agent, an ethylenically unsaturated polymerizable compound and a development inhibitor precursor having the formula (I):

in which A is a development inhibitor bonded through a hetero atom or a group capable of releasing the development inhibitor by an elimination reaction and the subsequent reaction, Y is an optional atom or group, and Z is an atom group required for forming a carbon ring or a hetero ring, and heat-developing the exposed light-sensitive material after or simultaneously with the above imagewise exposure to imagewise polymerize said polymerizable compound in the presence of a development inhibitor released from the precursor.

There is also provided by the present invention an image-forming method which comprises the steps of imagewise exposing to light a light-sensitive material comprising a support and a light-sensitive layer provided thereon which contains a silver halide, a reducing agent, an ethylenically unsaturated polymerizable compound and a development inhibitor precursor having the above-mentioned formula (I), and heat-developing the exposed light-sensitive material after or simultaneously with the above imagewise exposure to imagewise polymerize said polymerizable compound in the presence of a liquid in an amount of 10 to 400 wt. % of the polymerizable compound and a development inhibitor released from the precursor.

The development inhibitor precursor (i.e., blocked compound) having the formula (I) contained in the light-sensitive material employed in the invention can rapidly release a development inhibitor in an appropriate stage of the heat developing procedure. Accordingly, an excessive development is effectively avoided and the occurrence of unevenness of the resulting image likely caused by variation of the developing temperature is avoided, and thereby an excellent image can be obtained.

Especially in the image-forming method of the invention in which the light-sensitive layer contains a specific amount of liquid, there can be almost completely avoided unfavorable influences of oxygen on the polymerization reaction (i.e., polymerization-inhibiting function of oxygen) owing to the presence of the liquid. As a result, the polymerization reaction can be accelerated, and an image of high sharpness can be obtained by developing even at a low temperature such as a temperature of 50° to 100° C. In the case of introducing a liquid into the light-sensitive layer during the heating stage, decomposition of the development inhibitor precursor can be further accelerated, and hence the time of releasing the development inhibitor can be readily controlled. The image-forming method of the invention utilizes a means of introducing a liquid into the light-sensitive layer for the purpose of avoiding unfavorable influences of oxygen in the development stage, and this means can be more easily conducted as compared with other means which are conventionally known in the heat-development system such as a means of using an atmosphere having a substantially lower content of oxygen than that in air in the heat development, a means of using an oxygen-impermeable cover as described in Japanese Patent Provisional Publication No. 62(1987)-210461, and a means of introducing two or more mercapto groups into the light-sensitive layer of the light-sensitive material as described in Japanese Patent Provisional Publication No. 62(1987)-209443. Moreover, in the case that the amount of the liquid is specified as above in the invention, a process for removing the remaining liquid (i.e., drying process) is unnecessary after the developing process.

DETAILED DESCRIPTION OF THE INVENTION

The development inhibitor precursor contained in the light-sensitive material employable in the invention is a compound having the formula (I):

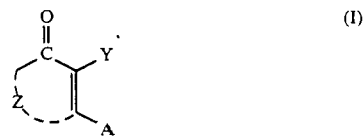

in which A is a development inhibitor bonded through a hetero atom or a group capable of releasing a development inhibitor by an elimination reaction and the subsequent reaction, Y is an optional atom or group, and Z is an atom group required for forming a carbon ring or a hetero ring.

The compound having the formula (I) preferably is a compound expressed by the following formula (II):

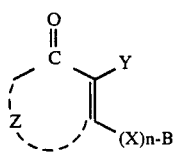

in which B is a development inhibitor bonded through a hetero atom; X is a divalent linkage group; n is 0 or 1; Y is at least one group selected from the group consisting of hydrogen atom, halogen atom, alkyl group, alkenyl group, aryl group, alkoxy group, aryloxy group, acyloxy group, carbonic acid ester group, amino group, carbonamide group, ureido group, carboxyl, oxycarbonyl group, carbamoyl group, acyl group, sulfo, sulfonyl group, sulfamoyl group, alkylthio group, arylthio group, cyano and nitro; and Z is a group of carbon atoms needed for forming a carbon atom ring or a hetero ring.

The development inhibitor indicated by B in the formula (II) is a known development inhibitor having a hetero atom and bonded through the hetero atom. Examples of the developing inhibitors are various developing inhibitors (including antifogging agents) such as mercaptotetrazoles, mercaptotriazoles, mercaptopyrimidines, mercaptobenzimidazoles, mercaptoimidazoles and mercaptothiadiazoles.

Those development inhibitors are described, for example, in Japanese Patent Provisional Publication No. 60(1985)-294337.

X in the formula (II) is a divalent linkage group bonded through a hetero atom, and is also a group rapidly releasing B after cleaved as X-B in the developing stage.

Examples of the linkage groups include a group releasing B by means of a ring-closure reaction in the molecule as described in Japanese Patent Provisional Publication No. 54(1979)-145135 (British Patent No. 2,010,818A), a group releasing B by means of electron movement in the molecule as described in British Patent No. 2,072,363 and Japanese Patent Provisional Publication No. 57(1982)-154234, a group releasing B with elimination of carbonic acid gas as described in Japanese Patent Provisional Publication No. 57(1982)-179842, and a group releasing B with formalin elimination as described in Japanese Patent Provisional Publication No. 57(1982)-203446.

Representative examples of the linkage groups are as follows:

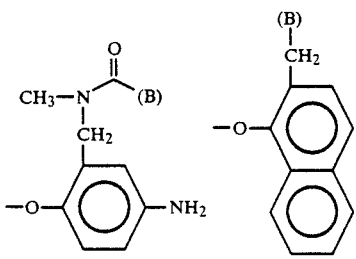

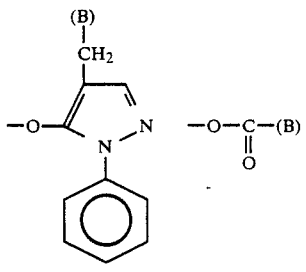

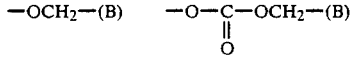

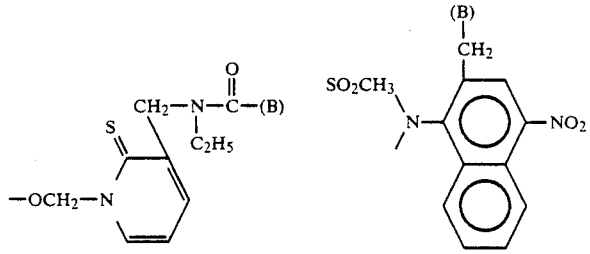

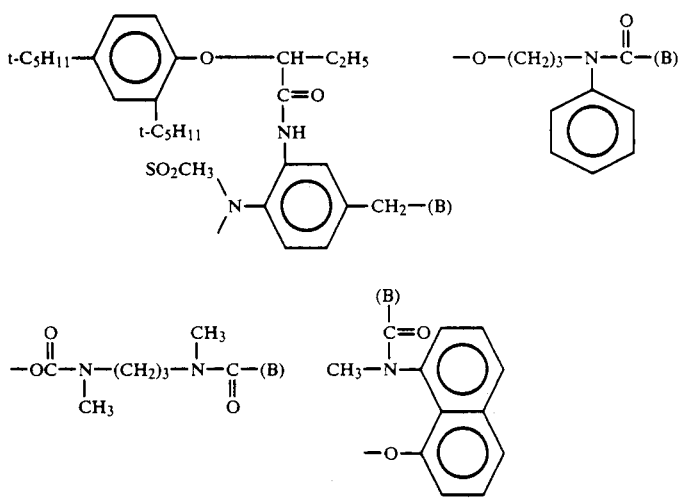

-continued

As the preferred atoms or groups indicated by Y, there can be mentioned fluorine, chlorine or bromine as the halogen atom; an alkyl group having 1-20 carbon atoms as the alkyl group; an alkenyl group having 2-20 carbon atoms as the alkenyl group; an alkoxy group having 1-20 carbon atoms as the alkoxy group; an aryl group having 6-20 carbon atoms as the aryl group; an aryloxy group having 6-20 carbon atoms as the aryloxy group; an unsubstituted amino, or a secondary or tertiary amino group substituted by an alkyl group having 1-20 carbon atoms or an aryl group having 6-20 carbon atoms as the amino group; an alkylcarbonyl amide group having 1-20 carbon atoms or an arylcarbonyl amide group having 6-20 carbon atoms as the carbonyl amide group; an alkylureido group having 1-20 carbon atoms or an arylureido group having 6-20 carbon atoms as the ureido group; an alkylcarbonic acid ester group having 1-20 carbon atoms or an arylcarbonic acid ester group having 6-20 carbon atoms as the carbonic acid ester group; an alkyloxycarbonyl group having 1-20 carbon atoms or an aryloxycarbonyl group having 6-20 carbon atoms as the oxycarbonyl group; an alkylcarbamoyl group having 1-20 carbon atoms or an arylcarbamoyl group having 6-20 carbon atoms as the carbamoyl group; an alkylacyl group having 1-20 carbon atoms or an arylacyl group having 6-20 carbon atoms as the acyl group; an alkylsulfonyl group having 1-20 carbon atoms or an arylsulfonyl group having 6-20 carbon atoms as the sulfonyl group; an alkylsulfamoyl group having 1-20 carbon atoms or an arylsulfamoyl group having 6-20 carbon atoms as the sulfamoyl group; and an alkylthio group having 1-20 carbon atoms as alkylthio group or an arylthio group having 6-20 carbon atoms as the arylthio group.

The above-mentioned alkyl groups or aryl groups may be further substituted by the aforementioned substituents. It is thought that the above-mentioned Y influences on a speed of the cleavage reaction of X-B, and in the case that a rapid cleavage reaction is required at an appropriate time, Y preferably is an electron withdrawing group.

The ring formed by Z is, for example, a carbon ring of 5 members, 6 members or 7 members, or a hetero ring of 5 members, 6 members or 7 members containing one or more nitrogens, oxygens or sulfur atoms. The hetero rings may further form a condensation ring.

Concrete examples of the carbon rings or the hetero rings include cyclopentenone, cyclohexanone, cycloheptenone, benzocycloheptenone, 4-pyridone, 4-quinolone, 2-pyrone, 4-pyrone, 1-thio-2-pyrone, 1-thio-4-pyrone, coumarin, chromone and uracil.

The above-mentioned carbon rings or hetero rings may have one or more of the following substituent groups, and in the case of having two or more substituent groups, those groups may be the same as or different from each other.

Examples of the substituent groups include halogen atom (e.g., fluorine, chlorine, bromine), alkyl group (preferably having 1-20 carbon atoms), aryl group (preferably having 6-20 carbon atoms), alkoxy group (preferably having 1-20 carbon atoms), aryloxy group (preferably having 6-20 carbon atoms), alkylthio group (preferably having 1-20 carbon atoms), arylthio group (preferably having 6-20 carbon atoms), acyl group (preferably having 2-20 carbon atoms), acylamino group (preferably, alkanoylamino group having 1-20 carbon atoms or benzoylamino group having 6-20 carbon atoms), nitro, cyano, oxycarbonyl group (preferably alkoxycarbonyl group having 1-20 carbon atoms or aryloxycarbonyl group having 6-20 carbon atoms), hydroxyl, carboxyl, sulfo, ureido group (preferably alkylureido group having 1-20 carbon atoms or arylureido group having 6-20 carbon atoms), sulfonyl amide group (preferably alkylsulfonyl amide group having 1-20 carbon atoms or arylsulfonyl amide group having 6-20 carbon atoms), sulfamoyl group (preferably alkylsulfamoyl group having 1-20 carbon atoms or arylsulfamoyl group having 6-20 carbon atoms), carbamoyl group (preferably alkylcarbamoyl group having 1-20 carbon atoms or arylcarbamoyl group having 6-20 carbon atoms), acyloxy group (preferably having 1-20 carbon atoms), amino group (unsubstituted amino, preferably secondary or tertiary amino group substituted by alkyl group having 1-20 carbon atoms or aryl group having 6-20 carbon atoms), carbonic acid ester group (preferably alkylcarbonic acid ester group having 1-20 carbon atoms or arylcarbonic acid ester group having 6-20 carbon atoms), and sulfonyl group (preferably alkylsulfonyl group having 1-20 carbon atoms or arylsulfonyl group having 6-20 carbon atoms).

The compound having the formula (II) preferably is a compound expressed by the following formula (III-1)

(i.e., cyclopentenone compound) or a compound expressed by the following formula (III-2) (i.e., uracil compound):

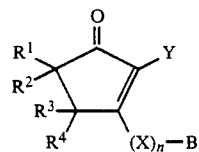
(III-1)

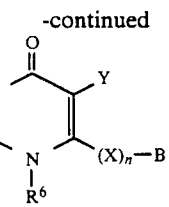
(III-2)

in which B, X, Y and n have the same meanings as defined in the formula (II); and $R^1$, $R^2$, $R^3$, $R^4$, $R^5$ and $R^6$ have the same meanings as those of the substituent groups of the carbon ring or hetero ring formed by Z.

Examples of the development inhibitor precursors preferably employed in the invention are given below, but those examples by no means restrict the precursors employable in the invention.

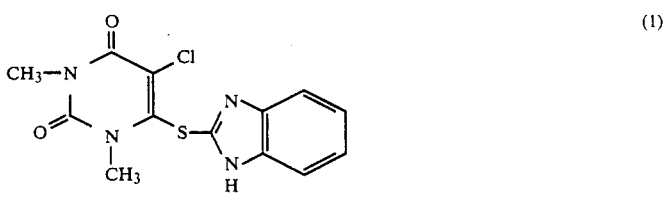
(1)

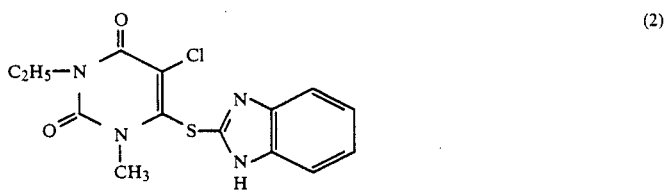
(2)

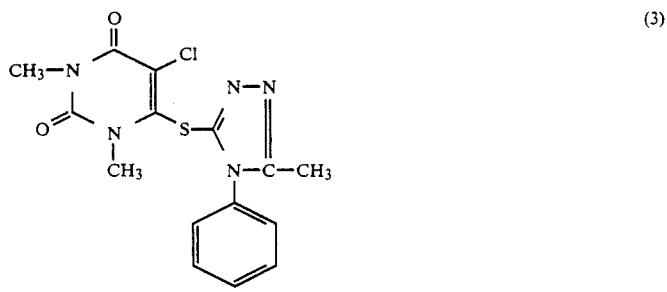
(3)

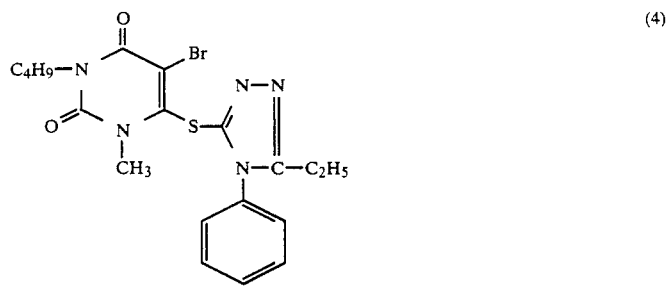
(4)

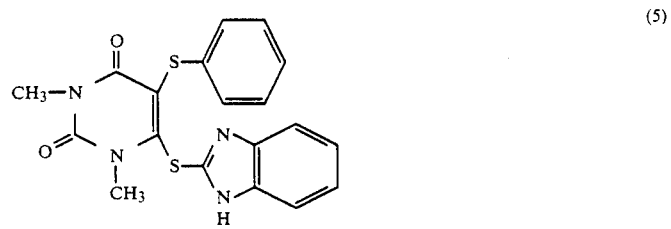
(5)

-continued
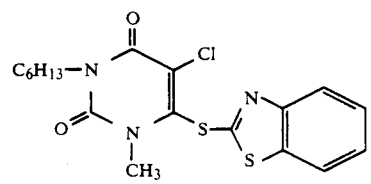
(6)
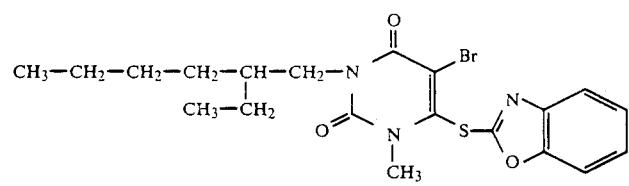
(7)
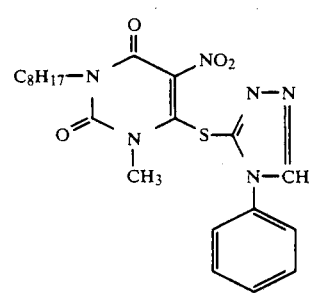
(8)
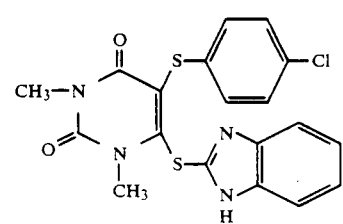
(9)
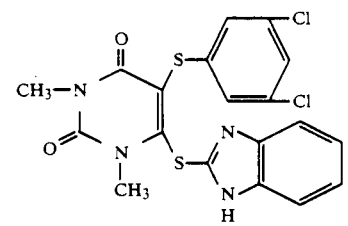
(10)
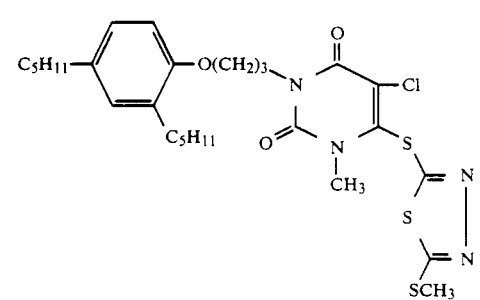
(11)

-continued
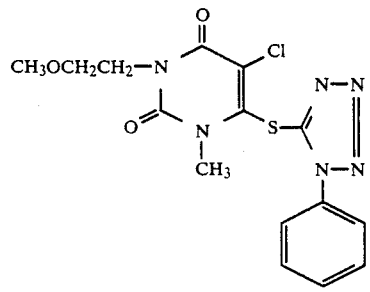
(12)
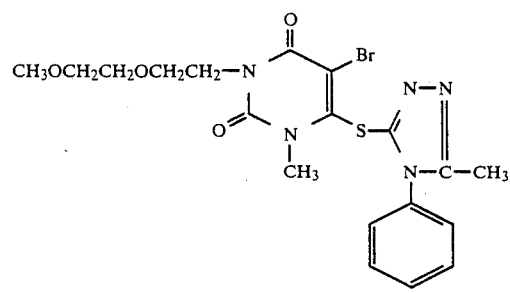
(13)
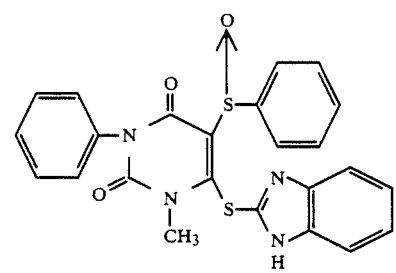
(14)
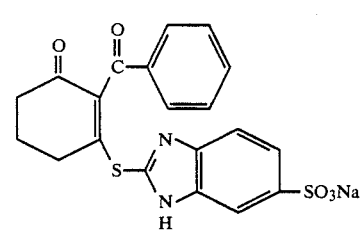
(15)
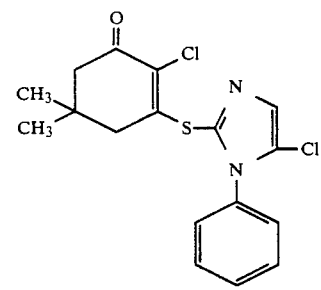
(16)
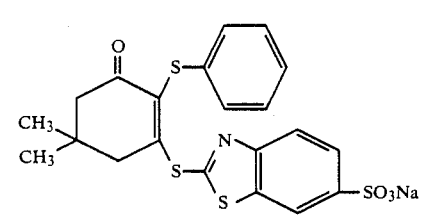
(17)

-continued
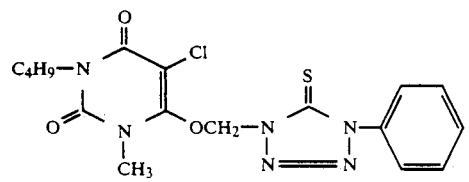
(18)
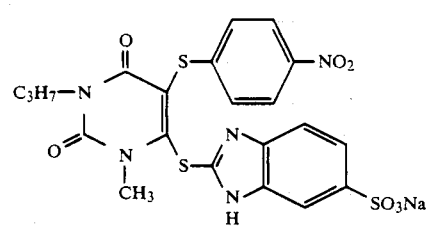
(19)
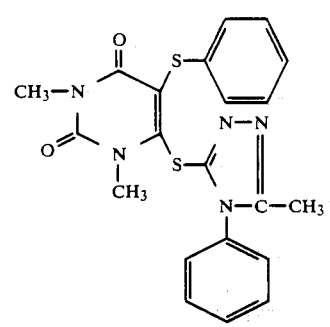
(20)
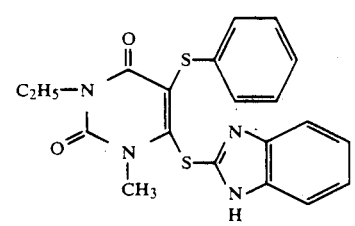
(21)
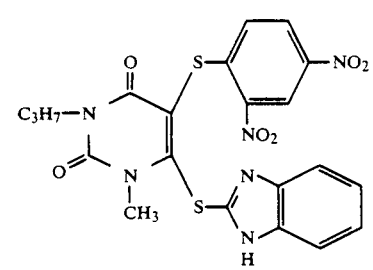
(22)
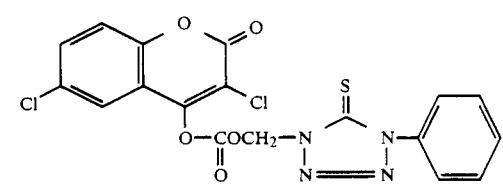
(23)

-continued
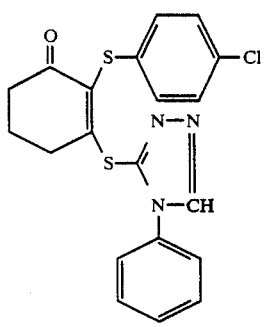
(24)
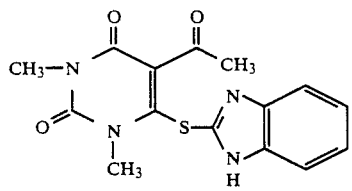
(25)
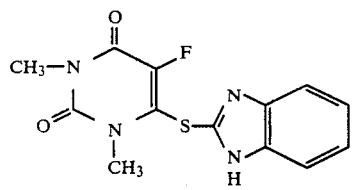
(26)
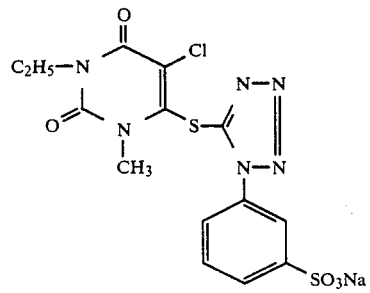
(27)
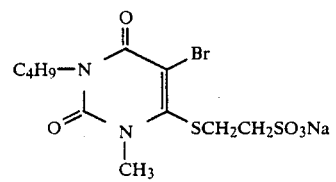
(28)
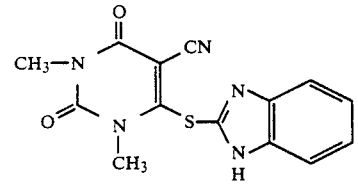
(29)
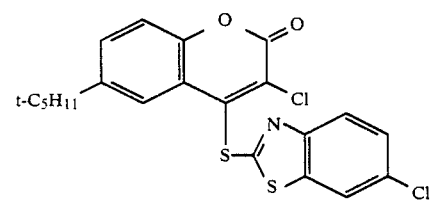
(30)

-continued

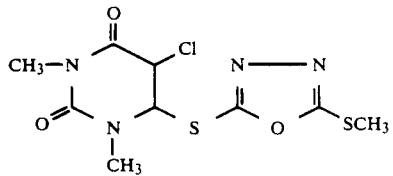
(31)

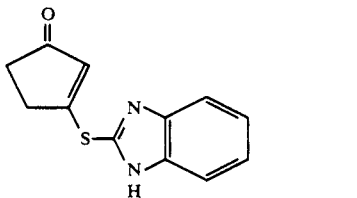
(32)

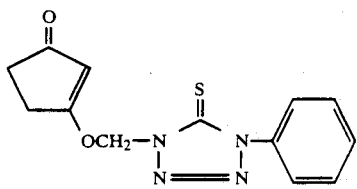
(33)

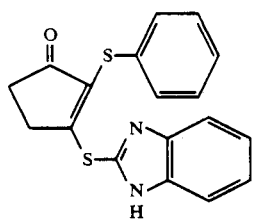
(34)

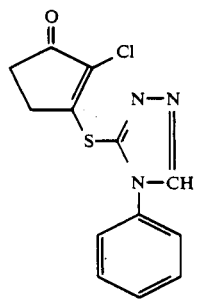
(35)

The development inhibitor precursor (i.e., blocked compound) having the formula (I) is added in the light-sensitive layer-forming stage.

In general, the compound can be added by introducing the compound per se into the coating solution for the formation of a light-sensitive layer, or by dissolving the compound in an appropriate solvent (e.g., alcohol) and then introducing the obtained solution into the coating solution. Otherwise, it is also possible that the compound is dissolved in a high-boiling point organic solvent or a low-boiling organic solvent, then the obtained solution is emulsified and dispersed in an aqueous solution, and the resulting solution is introduced into the coating solution for the formation of a light-sensitive layer. Further, the compound can be added to the coating solution by dispersing the compound in a solvent which sparingly dissolves the compound. In this case, the compound generally has a perticle size of 0.001 to 5 μm, more preferably 0.01 to 1 μm.

In the invention, the development inhibitor precursor is preferably contained in an amount of $10^{-8}$ to $10^{-1}$ mole, more preferably $10^{-3}$ to $5 \times 10^{-2}$ mole, per 1 mole of silver.

The image-forming method of the present invention will be described below.

In the image-forming method of the invention, the light-sensitive material containing the above-mentioned development inhibitor precursor having the formula (I) is heat-developed simultaneously with or after imagewise exposure to polymerize the polymerizable compound in the presence of a development inhibitor released from the development inhibitor precursor in the course of the heat development.

Various exposure means can be employed in the imagewise exposure, and in general, a latent image of the silver halide is obtained by imagewise exposure to radiation including visible light. The kind of light source or the amount of exposure can be selected depending on the light-sensitive wavelength determined by spectral sensitization or sensitivity of silver halide. Original image can be either monochromatic image or color image.

Development of the light-sensitive material can be conducted simultaneously with or after the imagewise exposure.

Heating of the light-sensitive material in the heat-development process can be conducted in various known manners. A heating layer may be provided on the light-sensitive material as a heating means as described in Japanese Patent Provisional Publication No. 61(1986)-294434. The heating of the light-sensitive material can be also conducted while suppressing supply of oxygen into the light-sensitive layer as described in Japanese Patent Provisional Publication No. 62(1987)-210461..The temperature for the heat-development process is generally in the range of 80° to 200° C., preferably 100° to 160° C. The heating time is generally not shorter than 1 second, preferably from 1 to 5 minutes, more preferably from 1 second to 1 minute.

In the image-forming method of the invention, the light-sensitive material can be developed at a temperature of not lower than 50° C. under such condition that the light-sensitive layer of the light-sensitive material contains a liquid in an amount of 10 to 400 wt. % of the polymerizable compound.

There is no specific limitation on the liquid to be contained in the light-sensitive layer, and any liquid can be employed, provided that the liquid does not disturb the developing reaction of the light-sensitive material (i.e., reduction of the silver halide and polymerization of the polymerizable compound).

When the polymerizable compound is a liquid, the above-mentioned liquid preferably is not miscible with the polymerizable compound. When the polymerizable compound is solid, the above-mentioned liquid preferably is a liquid which does not dissolve the polymerizable compound.

In the case that the polymerizable compound is hydrophobic, water or a hydrophilic liquid is preferably employed as the liquid, and in this case, it is preferred that the liquid such as water or a hydrophilic liquid is introduced into the light-sensitive layer by beforehand adding a hydrophilic binder to the light-sensitive layer and allowing the hydrophilic binder to absorb the liquid such as water or a hydrophilic liquid. When the hydrophobic polymerizable compound is used in combination with water (or hydrophilic liquid) and a hydrophilic binder as described above, the polymerizable compound is preferably contained microcapsules having hydrophobic shell.

A hydrophilic binder is preferably used in combination with a hardener. When the hydrophilic binder is hardened, the light-sensitive layer containing a liquid such as water can be improved in the physical properties.

There is no specific limitation on the hardening agent employable in the light-sensitive material. Examples of known hardening agents include aldehydes such as formaldehyde, glyoxal and glutaraldehyde, N-methylol compounds such as dimethylol urea and methylol dimethylhydantoin, dioxane derivatives such as 2,3-dihydroxydioxane, active vinyl compounds such as 1,3,5-triacryloylhexahydro-s-triazine, bis(vinylsulfonyl)-methyl ether, N,N'-ethylene-bis(vinylsuflonylacetamide) and N,N'-trimethylene-bis(vinylsulfonylacetamide), active halogen compound such as 2,4-dichloro-6-hydroxy-s-triazine, mucohalogen acids such as mucochloric acid and mucophenoxychloric acid, isooxazole, dialdehyde starch, 1-chloro-6-hydroxytriazinylated gelatin, and epoxy compounds such as

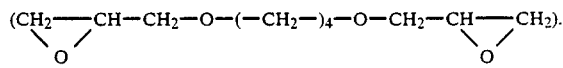

The hardening agent is preferably employed in an amount of 0.1 to 30 wt. %, more preferably 0.5 to 10 wt. %, of the hydrophilic binder.

The term "liquid" used in the invention means a material showing a liquid phase at the lowest temperature required for the heat development (generally, 50° C.). Concretely, the liquid has a melting point of not higher than 50° C. and a boiling point of not lower than 50° C., (preferably 50° to 200° C.).

From the above-mentioned viewpoints, examples of the liquids preferably employed in the image-forming method of the invention include water and hydrophilic liquids such as ethylene glycol, dimethylformamide (DMF), diisobutyl ketone and methyl cellosolve. Most preferred is water. Those liquids may contain other materials such as materials participating in the development, and examples of the materials include the aforementioned bases and base precursors.

The liquid may be introduced into the light-sensitive layer before or simultaneously with the imagewise exposure. Otherwise, the introduction thereof may be conducted between the imagewise exposure and the developing process or simultaneously with the developing process. Preferably, the liquid is introduced into the light-sensitive layer after the imagewise exposure and prior to the developing process. In other words, it is preferred that the imagewise exposure, introduction of the liquid and the developing process are made in this order.

For introducing the liquid into the light-sensitive layer, there can be employed various methods such as a method of coating the liquid on the light-sensitive layer, a method of spraying the liquid on the light-sensitive layer, a method of impregnating the light-sensitive layer with the liquid and a method of superposing the light-sensitive layer on other sheet containing the liquid. Most preferred is a coating method. The amount of the liquid to be contained in the light-sensitive layer is preferably in the range of 20 to 200 wt. %.

In the case of using water as the liquid, the amount of water to be contained in the light-sensitive layer is preferably kept in the range of 1 to 100 % of the weight of water corresponding to the maximum swelling volume of the coated layer on the light-sensitive layer side. Further, the water content is preferably in the range of 0.1 to 30 g, more preferably 1 to 20 g, per 1 m² of the surface area of the light-sensitive material.

The heating temperature in the image-forming method of the invention is preferably in the range of 50° to 100° C., more preferably 60° to 100° C. The heating time is generally in the range of 1 second to 5 minutes, preferably 5 to 30 seconds.

The developing process can be performed simultaneously or immediately after adding the aforementioned base or base precursor to the light-sensitive layer instead of containing the base or base precursor in the light-sensitive material. In this case, employment of a sheet containing the base or base precursor (i.e., base sheet) is most easy and preferred. The image-forming method using the base sheet is described in Japanese Patent Provisional Publication No. 63(1988)-32546.

In the above developing process, a polymerizable compound within the area where a latent image of the silver halide has been formed or within the area where a latent image of the silver halide has not been formed is polymerized. In a general system, the polymerizable compound within the area where the latent image has been formed is polymerized. However, the polymerizable compound within the area where the latent image has not been formed can be polymerized by controlling the kind or amount of the reducing agent, as described in Japanese Patent Provisional Publication No. 62(1987)-70BS6.

Through the heat-developing process, a polymer image can be formed on the light-sensitive layer. A color image can be also obtained by fixing a dye or pigment on the polymer image.

As described in Japanese Patent Provisional Publication No. 62(1987)-209444, a color image can be also formed on the light-sensitive material using two kinds of substances which form a color when brought into contact with each other. In this method, one of the substances is contained in microcapsules dispersed in the light-sensitive layer and the other is arranged outside of the microcapsules, and the light-sensitive material having been subjected to the development process is pressed to rupture the microcapsules so as to bring into contact the two kinds of substances with each other.

A polymer image can be also formed on an image-receiving material by using the image-receiving material. In detail, the light-sensitive material having been subjected to the heat development is superposed on an image-receiving material, and a pressure is applied to the light-sensitive material on the image-receiving material to transfer the unpolymerized polymerizable compound to the image-receiving material, whereby a polymer image can be formed on the image-receiving material. For applying a pressure on the light-sensitive material, various known methods can be employed in the invention.

In the case that the light-sensitive layer contains a color image forming substance, the light-sensitive material is subjected to the heat developing process to cure the polymerizable compound, and thereby the color image forming substance in the cured portion is fixed. Then, the light-sensitive material superposed on the image-receiving material is pressed to transfer the color image forming substance in the uncured portion to the image-receiving material. Thus, a color image can be formed on the image-receiving material.

After the image is formed on the image-receiving material, the image-receiving material can be heated to polymerize the transferred unpolymerized polymerizable compound as described in Japanese Patent Provisional Publication No. 62(1987)-210459. Through the above-mentioned process, the obtained image can be improved in the preservability.

The image-forming method of the invention can be used for monochromatic or color photography, printing, radiography, medical diagnosis (e.g., CRT photography of diagnostic device using ultrasonic wave), copy (e.g., computer-graphic hard copy), etc.

The light-sensitive material employable in the image-forming method of the present invention will be described in detail hereinafter.

A silver halide, a reducing agent, a polymerizable compound and a support constituting the light-sensitive material are described below in order.

Examples of the silver halides employable in the light-sensitive material include silver chloride, silver bromide, silver iodide, silver chlorobromide, silver chloroiodide, silver iodobromide and silver chloroiodobromide in the form of grains.

The halogen composition of individual grains may be homogeneous or heterogeneous. The heterogeneous grains having a multi-layer structure in which the halogen composition varies from the outer surface portion (i.e., SO shell) to the inside portion (i.e., core) are described Japanese Patent Provisional Publication Nos. 57(1982)-154232, 58(1983)-108533, 59(1984)-48755 and 59(1984)-52237, U.S. Pat. No. 4,433,048. and European Patent No. 100,984. A silver halide grain having a core/shell structure in which the silver iodide content in the shell is higher than that in the core described in Japanese Patent Provisional Publication No. 62(1987)-183453 can be also employed.

There is no specific limitation on the crystal habit of silver halide grains. For example, a tubular grain having an aspect ratio of not less than 3 can be used.

The silver halide grains preferably have such a relatively low tendency to be fogged that the amount of developed silver is not more than 5 weight % based on the total amount of silver when the unexposed silver halide grains are developed in 1 l of an aqueous developing solution containing 1.0 g of metal, 15.0 g of sodium sulfite, 4.0 g of hydroquinone, 26.7 g of sodium carbonate monhydrate and 0.7 g of patassium bromide.

Two or more kinds of silver halide grains which differ in halogen composition, crystal habit, grain size, and/or other features from each other can be employed in combination.

There is no specific limitation on grain size distribution of silver halide grains. For example, the silver halide grains having such a grain size distribution that the coefficient of the variation is not more than 20 $\alpha$ can be employed.

The silver halide grains preferably have a mean grain (or particle) size of 0.001 to 5 $\mu$m, more preferably 0.001 to 2 $\mu$m.

The amount of the silver halide (including an organic silver salt which is one of optional components) contained in the light-sensitive layer preferably is in the range of 0.1 mg/m$^2$ to 10 g/m$^2$ in terms of silver. The amount of only the silver halide contained in the light-sensitive layer preferably is not more than 1 g/m$^2$, more preferably in the range of 1 mg to 500 mg/m$^2$, in terms of silver.

The reducing agent employable in the light-sensitive material has a function of reducing the silver halide and/or a function of accelerating or restraining polymerization of the polymerizable compound. Examples of the reducing agents having those functions include various compounds such as hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, $\alpha$-sulfonamidoketones and hydrazines. By adjustment of the kinds, amounts, etc. of the above reducing agents, the polymerizable compound can be polymerized in either a portion where a latent image of the silver halide has been formed or a portion where a latent image has not been formed. When the polymerizable compound is polymerized in the portion where a latent image has not been formed, 1-phenyl-3-pyrazolidones are preferably employed as the reducing agent.

A variety of reducing agents having the abovementioned functions are described in Japanese Patent Provisional Publications Nos. 61(1986)-183640, 61(1986)-188585, 61(1986)-228441, 62(1987)-70836, 62(1987)-86354 and 62(1987)-86355, Japanese Patent Application No. 60(1985)-227528, and Japanese Patent Provisional Publication No. 62(1987)-198849. In these publications, some reducing agents are described as developing agents or hydrazone derivatives. The above-mentioned reducing agents are also described in T. James, "The Theory of the Photographic Process", 4th edition, pp. 291-334 (1977), Research Disclosure Vol. 170. No. 17029, pp. 9-15 (June 1978), and Research Disclosure Vol. 176, No. 17643, pp. 22-31 (December 1978). A precursor of the reducing agent capable of releasing a reducing agent when it is heated or brought into contact with an base can be employed in place of the reducing agent, as described in Japanese Provisional Publication No. 62(1987)-210446. The reducing agents and their precursors described in the above-mentioned publications and applications can be also employed for the light-sensitive material in the present invention. Accordingly, the terms "reducing agent(s)" in the present specification mean to include all of the reducing agents and the precursors described in the abovementioned publications and applications. The reducing agents can be used singly or in combination as described those publications and applications. In the case that two or more reducing agents are used in combination, certain interactions between these reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously, so that it is difficult to determine which of the interactions has occurred in practical use.

Concrete examples of the reducing agents include pentadecylhydroquinone, 5-t-butylcatechol, p-(N,N-diethylamino)phenol, 1-phenyl-4-methyl-4-hydroxymethyl-3-pyrazolidone, 1-phenyl-4-methyl-4-heptadecylcarbonyl-oxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphtol, 2-(N-methyl-N-octadecylcarbamoyl)-4-sulfonylaminonaphthol, 1-acetyl-2-phenylhydrazine, 1-acetyl-2-(p- or o-aminophenyl)hydrazine, 1-acetyl-2-(p- or o-aminophenyl)hydrazine, 1-acetyl-2-(- or o-methoxyphenyl)hydrazine, 1-lauroyl-2-(p- or o-aminophenyl)-hydrazine, 1-trityl-2- phenylhydrazine, 1-phenyl-2-(2,4,6-trichloropheny)hydrazine, 1-{2-(2,5-di-tert-pentylphenoxy)butyloyl}-2-(p- or o-aminophenyl)hydrazine, 1-{2-(2,5-di-t-pentylphenoxy)butyloyl)-2-(p- or o-aminophenyl)hydrazine pentadecylfluorocaprylate salt, 3-indazolinone, 1-(3,5-dichlorobenzoyl)-2-phenylhydrazine, 1-trityl-2-[{(2-N-butyl-N-octylsulfamoyl)-4-methanesulfonyl}phenyl]hydrazine, 1-{4-(2,5-di-tert-pentylphenoxy)butyloyl}-2-(p- or o-methoxyphenyl)-hydrazine, 1-(methoxycarbonylbenzohydryl) -2-phenylhydrazine, 1-formyl-2-[4-}2-(2,4-di-tert-pentylphenoxy)butylamide}phenyl]hydrazine, 1-acetyl-2-[4-{2-((2,4-di-tert-pentylphenoxy)butylamido}phenyl]hydrazine, 1-trityl-2-[{2,6-dichloro-4-(N,N-di-2-ethylhexyl)carbamoyl)phenyl]hydrazine, 1-(methoxycarbonylbenzohydryl)-2-(2,4-dichlorophenyl)hydrazine, 1-trityl-2-[2-(N-ethyl-N-octylsulfamoyl)-4-methanesulfonylphenyl]hydrazine, 1-benzoyl-2-tritylhydrazine, 1-(4-butoxybenzoyl)-2-tritylhydrazine, 1-(2,4-dimethoxybenzoyl)-2-tritylhydrazine, 1-(4-dibutylcarbamoylbenzoyl)-2-tritylhydrazine and 1-(1-naphthoyl)-2-tritylhydrazine.

The amount of the reducing agent in the light-sensitive layer preferably ranges from 0.1 to 1,500 mole % based on the amount of silver (including the abovementioned silver halide and the optional organic silver salt).

There is no specific limitation with respect to the polymerizable compound, except that the compound has an ethylenically unsaturated group. Any known ethylenically unsaturated polymerizable compounds including monomers, SO oligomers and poylmers can be contained in the light-sensitive layer. In the case that heat development (i.e., thermal development) is utilized for developing the light-sensitive material, a polymerizable compounds having a relatively higher boiling point (e.g., 80° C. or higher) is preferably employed, because it is hardly evaporated upon heating. In the case that the light-sensitive layer contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds. Further, in the case that the transferred image is formed on an image-receiving material, the polymerizable compound preferably has a viscosity of not lower than 100 cp at 25° C.

Examples of the compounds having an ethylenically unsaturated group include acrylic acid, salts of acrylic acid, acrylic esters, acrylamides, methacrylic acid, salts of methacrylic acid, methacrylic esters, methacrylamide, maleic anhydride, maleic acid esters, itaconic acid esters, styrene, styrene derivatives vinyl ethers. vinyl esters, N-vinyl heterocyclic compounds, allyl ethers, allyl esters, and derivatives thereof.

Concrete examples of the acrylic esters include n-butyl acrylate, cyclohexyl acrylate, 2-ethylhexyl acrylate, benzyl acrylate, furfuryl acrylate, ethoxyethoxyethyl acrylate. dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, dipentaerythritol hexacrylate, diacrylate of polyoxyethylenated bisphenol A, diacrylate of 2,2-dimethyl-3-hydroxypropane aldehyde and trimethylolpropane condensate, triacrylate of 2,2-dimethyl-3-hydroxypropion aldehyde and pentaerythritol condensate, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. The light-sensitive material containing mixture of two or more polymerizable componds is described in Japanese Patent Provisional Publication No. 62(1987)-210445. Further, compounds formed by bonding a polymerizable group such as a vinyl group or a vinylidene group to a reducing agent is also employed as the polymerizable compounds. The light-sensitive materials using compounds which show functions as both the reducing agent and the polymerizable compound or both the color image forming substance and the polymerizable compound are included in embodiments of the light-sensitive material employable in the invention.

The amount of the polymerizable compound to be contained in the light-sensitive layer preferably ranges from 5 to 120,000 parts by weight, and more preferably from 12 to 12,000 parts by weight, per one part by weight of the silver halide.

The light-sensitive material can be prepared by arranging a light-sensitive layer containing the above-mentioned components on a support. There is no specific limitation with respect to the support. In the case that heat development is utilized in the use of the light-sensitive material, a material for the support preferably is resistant to heat given in the developing stage. Examples of the material employable for the preparation of the support include glass, paper, fine paper, coat paper, cast-coat paper, synthetic paper, metals and analogues thereof, films of polyester, acetyl cellulose, cellulose ester, polyvinyl acetal, polystyrene, polycarbonate and polyethylene terephthalate, and paper laminated with resin or polymer (e.g., polyethylene).

In the case that a porous material such as paper is employed as the support, the porous support preferably has such a surface characteristic that a filtered maximum waviness of not less than 4 $\mu$m is observed in not more than 20 position among 100 positions which are determined at random on a filtered waviness curve obtained according to JIS-0610. A surface of a paper support preferably has a low water absorptiveness of not more than 3 g/m$^2$ which is a value measured according to Cobb test method. A surface of the paper support preferably has such a smooth surface that the smoothness value in tems of the Bekk Smoothness is not less than 300 seconds. A paper support preferably has a low shrinkage ratio of not more than 0.15 % both in the machine direction and in the cross direction, wherein the shrinkage ratio is a value measured at the change of relative humidity from 75% to 60% . Further, a paper support preferably has a low air permeability of not less than 300 seconds, wherein the air permeability is a time required for 100 m& of air to pass through the paper support of an area of 645 mm$^2$ at pressure of 567 g. Furthermore, a paper support preferably has a pH value in the range of 5 to 9.

Various embodiments of the light-sensitive materials, optional components which may be contained in the light-sensitive layer, and auxiliary layers which may be optionally arranged on the light-sensitive materials are described below.

In the light-sensitive material employable in the invention, the polymerizable compound is preferably dispersed in the light-sensitive layer in the form of oily droplets, as described in Japanese Patent Provisional Publication No. 62(1987)-78552. In the oily droplets may be contained other components for the formation of a light-sensitive layer such as a silver halide, a reducing agent and a color image forming substance. The light-sensitive material in which the silver halide is contained in the oily droplets is described in Japanese Patent Provisional Publication No. 62(1987)-00450, and the light-sensitive material in which the reducing agent is further contained in the oily droplets is described in Japanese Patent Provisional Publication No. 62(1987)-183453. When the silver halide is to be contained in the oily droplets, the number of the silver halide grains to be contained in one oily droplent preferably is 5 or more, as described in Japanese Patent Application No. 61(1986)-160592.

The oily droplet of the polymerizable compound is more preferably in the form of microcapsule. There is no specific limitation on the process for the formation of the microcapsule, and any known process can be applied to the invention. The light-sensitive material in which the oily droplet of the polymerizable compound is in the form of microcapsule is described in Japanese Patent Provisional Publication No. 61(1986)-278441.

In the case that the silver halide is contained in the microcapsule, the silver halide is preferably exist in the shell of the microcapsule, as described in Japanese Patent Provisional Publication No. 62(1987)-169147.

There can be employed two or more kinds of microcapsules in combination which are different from each other in at least one component among the components capable of being contained in microcapsules such as a silver halide, a reducing agent, a polymerizable compound and a color image forming substance (optional component, described hereinafter). Especially in the case of forming a full-color image, three or more kinds of microcapsules having different color forming phases are preferably employed in combination. The light-sensitive materials using two or more kinds of microcapsules in combination are described in Japanese Patent Provisional Publication No. 62(1987)-198850.

The mean size (particle) of the microcapsule preferably is in the range of 3 to 20 $\mu$m. The microcapsule preferably has a homogeneous particle distribution as described in Japanese Patent Application No. 61(1986)-227767.

In the case that the silver halide grains are contained in microcapsules, the means grain size of the silver halide preferably is not more than one fifth parts of the mean size of the microcapsules, more preferably not more than one tenth parts of the mean size of the microcapsules. When the means size of the microcapsules is not more than one fifth parts of the mean grain size of silver halide, even and uniform image can be obtained.

The light-sensitive layer may further contain optional components such as color image forming substances, sensitizing dyes, organic silver salts, radical generators, various kinds of image formation accelerators, thermal polymerization inhibitors, thermal polymerization initiators, development stopping agents, fluorescent brightening agents, discoloration inhibitors, antihalation dyes or pigments, antirradiation dyes or pigments, dyes discolored by irradiation with light, matting agents, antismudging agents, plasticizers, water releasers, binders, photo polymerization initiators, solvents of the polymerizable compound and water soluble vinyl polymers.

In the light-sensitive material, a polymer image can be obtained on the light-sensitive layer having the above-mentioned constitution. Further, a color image can be obtained on the light-sensitive layer by incorporating a color image forming substance into the light-sensitive layer.

There is no specific limitation with respect to the color image forming substance, and various kinds of substances can be employed. Example of the color image forming substance include colored substance (i.e., dyes and pigments) and non-colored or almost non-colored substance (i.e., color former or dye- or pigment-precursor) which develops to give a color under application of external energy (e.g., heating, pressing, light irradiation, etc.) or by contact with other components (i.e., developer). The light-sensitive material using the color image forming substance is described in Japanese Patent Provisional Publication No. 61(1986)-73145(corresponding to U.S. Pat. No. 4,020,676 and European Patent Provisional Publication No. 01746342A2).

Examples of the dyes and pigments (i.e., colored substances ) employable in the invention included commercially available ones, as well as various known componds described in the technical publication, e.g., Yuki Gosei Kagaku Kyokai (ed.). Handbook of Dyes (in Japanese, 1970) and Nippon Ganryo Gijutsu Kyokai (ed.), New Handbook of Pigments (in Japanese, 1977). These dyes and pigments can be used in the form of a solution or a dispersion.

Examples of the substances which develop to give a color by certain energy includes thermochromic compounds, piezochromic compounds, photochromic compounds and leuco compounds derived from triarylmethane dyes, quinone dyes, indigoid dyes, azine dyes, etc. These compounds are capable of developing a color by heating, application of pressure, light-irradiation or air-oxidation.

Examples of the substances which develop to give a color in contact with other components include various compounds capable of developing a color through some reaction, chelating reaction, and the like. Examples of such color formation systems are described in Hiroyuki Moriga, "Introduction of Chemistry of Speciality Paper" (in Japanese, 1975 ), pp. 20–58 (pressure-sensitive copying paper), pp 87–95 (azo-graphy), pp. 118–120 (heat-sensitive color formation by a chemical change) or in MSS. of the seminer promoted by the Society of Kinki Chemical Industry, "The Newest Chemistry of Coloring Matter—Attractive Application and New Development as a Functional Coloring Matter", pp. 26–32 (June, 19, 1980). Examples of the color formation systems specifically include a color formation system used in pressure-sensitive papers, etc., comprising a color former having a partial structure of lactone, spiropyran, etc., and an acidic substance (developer), e.g., acid clay, phenol, etc.; a system utilizing azo-couping reaction between an aromatic a diazonium salt, diazotate or diazosulfonate and naphthol, aniline, active methylene, etc.; a system utilizing a chelating reaction, such as a reaction between hexamethylenetetramine and a ferric ion and gallic acid, or a reaction between a phenolphtalein-complexon and an alkaline earth metal ion; a system utilizing oxidation-reduction reaction, such as a reaction between ferric stearate and pyragallol, or a reaction between silver behenate and 4-methoxy-1-naphthol, etc.

The color image forming substance is preferably used in an amount of 0.5 to 20 parts by weight, more preferably 2 to 7 parts by weight, per 100 parts by weight of the polymerizable compound. In the case that the developer is employed, the amount of the developer is preferably in the range of approx. 0.3 to 80 parts by weight per one part by weight of the color former.

In the case of using two kinds of color image forming substances which give a color when they are brought into contact with each other (e.g., color former and a developer), one substance and the polymerizable compound are contained in the microcapsule, and the other is arranged outside of the microcapsule in the light-sensitive layer, whereby a color image can be formed on the light-sensitive layer.

There is no specific limitation with respect to the sensitizing dyes, and any known sensitizing dyes used in the conventional art of photography may be employed in the light-sensitive material. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be employed singly or in combination, but two or more sensitizing dyes are generally employed in combination for the purpose of supersensitization. In addition to the sensitizing dye, a substance which does not per se exhibit spectral sensitization effect or does not substantially absorb visible light but shows supersensitizing activity can be employed. The amount of the sensitizing dye to be added generally ranges from approx. $10^{-8}$ to $10^{-2}$ mole per 1 mole of the silver halide. The sensitizing dye is preferably added during the stage of the preparation of the silver halide emulsion (simultaneously with or after the grain formation).

Adding of an organic silver salt to the light-sensitive material is particularly effective for the heat development. The reason is assumed that the organic silver salt takes part in a redox reaction using a silver halide latent image as a catalyst when heated to a temperature of 80° C. or higher. In such case, the organic silver salt is preferably located in contact with the silver halide or closely to the silver halide. Examples of organic compounds employable for forming such organic silver salt include aliphatic or aromatic carboxylic acids, thiocarbonyl group-containing compounds having a mercapto group or an α-hydrogen atom, and imino group-containing compounds. Among them, benzotriazoles are most preferred. The organic silver salt is generally used in an amount of from 0.01 to 10 mole, preferably from 0.01 to 1 mole, per 1 mole of the silver halide. Instead of the organic silver salt, an organic compound (e.g., benzotriazole) which can form an organic silver salt in combination with an inoganic silver salt can be added to the light-sensitive layer to obtain the same effect.

Various image formation accelerators are employable in the light-sensitive material. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer (described hereinafter), or a similar function. The image formation accelerators can be classified into inorganic bases, organic bases, base precursors, oils, surface active agents, compounds functioning as an antifogging agent and/or a development accelerator, hot-melt solvents, compounds functioning as antioxidants, and the like, from the viewpoint of physicochemical functions. These groups, however, generally have certain combined functions, that is, two or more of the above-mentioned effects, so that the above classification is for the sake of convenience, and one compound often has a plurality of functions combined.

Examples of the image formation accelerators are given below.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent; ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxylalkylsubstituted aromatic amines and bis[p-(dialkylamino)phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts between bases and organic acids capable of decarboxylation by heating, compounds capable of releasing amines through intramolecular nucleophilic substitution, Lossen rearrangement, or Beckmann rearrangement, and the like; and those capable of releasing bases by electrolysis. Preferred examples of the base precursors include guanidine trichloroacetate, piperidine trichloroacetate, morpholine trichloroacetate, p-toluidine trichloroacetate, 2-picoline trichloroacetate, guanidine phenylsulfonylacetate, guanidine 4-chlorophenylsulfonylacetate, guanidine 4-methyl-sulfonylphenylsulfonylacetate, and 4acetylaminomethyl propionate. In the invention, there can be preferably used a base composed of a salt of carbonic acid and an organic base of di- to tetra-acid base derivated guanidine (bis-type guanidine) as the base precursor.

The bases or the base precursors can be employed in the amount of wide range in the light-sensitive material. The base or base precursor is preferably employed in an amount of not more than 100 % by weight, more preferably from 0.1 to 40 % by weight, based on the total solid content of the light-sensitive layer. These bases or base precursors can be used singly or in combination.

The base or base precursor can be arranged outside of the microcapsules containing the components of the light-sensitive layer, such as silver halide and polymerizable compound. In this case, the base or base precursor preferably is a hydrophobic compound having a melting point of 80° C. to 180° C. in the form of solid particles.

A base precursor can be used in combination with a catalyst for decomposing the base precursor can be used in combination with a catalyst such as silver, copper, a silver compound and a copper compound. Further, the propiolate type base precursor or a sulfonylacetate type base precursor can be used in combination with a hot-melt solvent, which functions as a catalyst for decomposing the base precursor.

In the light-sensitive material, the silver halide, the reducing agent and the polymerizable compound are preferably contained in microcapsules and the base or base precursor is preferably arranged outside of the microcapsule in the light-sensitive layer. Further, the base or base precursor can be contained in different microcapsules from those containing the polymerizable compound. The base or base precursor can be contained in the microcapsules under the condition that the base or base precursor is dissolved or dispersed in an aqueous solution of a water retention agent, or under the condition that the base or base precursor is adsorbed on solid particles. The base or base precursor contained in the microcapsules preferably has a melting point in the range of 70° to 210° C.

The base or base precursor can be contained in a layer different from the light-sensitive layer. Further, the base or base precursor can be contained in a porous support.

Examples of the oils employable in the invention include high-boiling point organic solvents which are used as solvents for emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The compounds functioning as an antifogging agent and/or a development accelerator are used to give a clear image having a high maximum density and a low minimum density (an image having high contrast). Examples of the compounds include a 5 -or 6-membered nitrogen containing heterocyclic compound (including a cyclic amide compound), a thiourea derivative, a thioether compound, an acetylene compound, a sulfonamide derivative and a quarternary ammonium salt.

The hot-melt solvents preferably are compounds which may be used as a solvent of the reducing agent or those which have high dielectric constant and can accelerate physical development of silver salts. The light-sensitive material employing the hot-melt solvent is described in Japanese Patent Application No. 60(1985)-227527.

The compounds functioning as an antioxidant can be employed for the purpose of eliminating the oxygen influence (oxygen has a function as a polymerization inhibitor). An example of the compounds functioning as an antioxidant is a compound having two or more mercapto groups as described in Japanese Patent Provisional Publication No. 62(1987)-209443.

The thermal polymerization initiators employable in the light-sensitive material are compounds which are decomposed under heating to generate a polymerization initiating species, particularly a radical, and those generally employed as an initiator of radical polymerization. The thermal polymerization initiators are described in "Addition Polymerization and Ring Opening Polymerization", pp. 6–18, edited by the Editorial Committee of High Polymer Experimental Study of the Polymer Institute, published by Kyoritsu Shuppan (1983). Examples of the thermal polymerization initiators include azo compound, e.g., azobisisobutyronitrile, 1,1'-azobis-(1cyclohexanecarbonitrile). dimethyl 2,2'-azobisiso-butyrate, 2,2'-azobis(2-methylbutyronitrile), and azobisdimethylvaleronitrile; organic peroxides, e.g., benzoyl peroxide, di-tert-butyl peroxide, dicumyl peroxide, tertbutyl hydroperoxide, and cumene hydroperoxide; inorganic peroxide, e.g., hydrogen peroxide, potassium persulfate, and ammonium persulfate; and sodium p-toluensulfinate. The thermal polymerization initiators are preferably used in an amount of from 0.1 to 120% by weight, more preferably from 1 to 10 % by weight, based on the amount of the polymerizable compound. In a system in which the polymerization initiators are preferably incorporated into the light-sensitive layer. The light-sensitive material employing the thermal polymerization initiators is stated in Japanese Patent provisional Publication No. 61(1986)-260241.

The binder employable in the light-sensitive material can be contained in the light-sensitive layer singly or in combination. The binder preferably is a hydrophilic binder, and representative hydrophilic binders are transparent or semi-transparent binders. Examples of the binders include natural substances such as gelatin, gelatin derivatives, cellulose derivatives, starch and gum arabic, and synthetic polymeric substances such as water-soluble polyvinyl compounds (e.g., polyvinyl alcohol, polyvinylpyrrolidone and acrylamide polymers). Other synthetic polymeric substances such as vinyl compounds dispersed in the form of latex, which are particularly effective to increase dimensional stability of photographic materials, can be also employed.

A photopolymerization initiator can be contained in the light-sensitive layer of the light-sensitive material for the purpose of polymerization of the transferred unpolymerized polymerizable compound, as described in Japanese Patent Provisional Publication No. 62(1987)-161149.

In the case of using a solvent for the polymerizable compound, the solvent is preferably contained in a microcapsule which is different from the microcapsule containing the polymerizable compound. The light-sensitive material employing a polymerizable compound contained in microcapsule and a blending organic solvent is described in Japanese Patent Provisional Publication No. 62(1987)-209524.

A water soluble vinyl polymer can be adsorbed on the aforementioned silver halide grains. The light-sensitive material employing the water soluble vinyl polymer is described in Japanese Patent Application No. 61(1986)-238870.

Examples and usage of other components than the above-mentioned ones which can be optionally contained in the light-sensitive layer are also described in the above-mentioned publications and applications concerning the light-sensitive material, and in Research Disclosure Vol. 70, No. 17029. pp. 9–15 (June 1978).

The light-sensitive layer of the light-sensitive material comprising the above-mentioned components preferably has a pH value of not more than 7 as described in Japanese Patent Application No 81(1986)-104226.

Examples of auxiliary layers which are optionally arranged on the light-sensitive material include an image-receiving layer, a heating layer, an antistatic layer, an anti-curling layer, a peel layer, a cover sheet, a protective layer, a layer containing a base or a base precursor, a base barrier layer and an anti-halation layer (colored layer).

A process for preparing the light-sensitive material is described below.

Various processes can be employed for preparing the light-sensitive material. In a generally known process, the light-sensitive material can be prepared by dissolving, emulsifying or dispersing each of the components of the light-sensitive layer in an adequate solvent to obtain a coating solution, then applying the solution onto the aforementioned support, and drying the coated layer of the solution.

The coating solution can be generally prepared by preparing liquid compositions each composition containing each component and mixing those compositions with each other. Each of the liquid compositions may contain plural components. Some components of the light-sensitive layer can be directly added to the coating solution or the liquid composition. Further, a secondary composition can be prepared by emulsifying the oily (or aqueous) composition in an aqueous (or oily) medium to obtain the coating solution.

Processes for the preparation of the liquid composition and the coating solution are described below.

The silver halide emulsion can be prepared by any known processes such as an acid process, a neutral process or an ammonia process.

In the stage for the preparation, a soluble silver salt and a soluble halogen salt can be reacted in accordance with a single jet process, a double jet process or a combination thereof. A reverse mixing method in which grains are formed in the presence of excess silver ions, or a controlled double jet process in which a pAg value is maintained constant, can be also employed. In order to accelerate grain growth, the concentrations or amounts or the silver salt and halogen salt to be added or the rate of their addition can be increased as described in Japanese Patent Provisional Publications Nos. 55(1980)-158124 and 55(1980)-158124, and U.S. Pat. No. 3,650,757.

The silver halide emulsion may be of a surface latent image type that forms a latent image predominantly on the surface of silver halide grains, or of an inner latent image type that forms a latent image predominantly in the inside of the grains. A direct reversal emulsion comprising an inner latent image type emulsion and a nucleating agent may be employed. The inner latent image type emulsion suitable for this purpose is described in U.S. Pat. Nos. 2,592,250 and 2,761,276, Japanese Patent Publication No. 58(1983)-3534 and Japanese Patent Provisional Publication No. 58(1983)-136641, etc. The nucleating agent that is preferably used in combination with the inner latent image type emulsion is described in U.S. Pat. Nos 3,227,552, 4,245,037, 4,255,511, 4,206,013 and 4,276,364, and West German Patent Provisional Publication (OLS) No. 2,635,316.

In the preparation of the silver halide emulsion, various hydrophilic colloids are advantageously used as protective colloids. Particularly preferred are gelatins. Examples of the employable gelatins include not only lime-treated gelatin but also acid-treated gelatin and enzyme-treated gelatin. Hydrolysis products or enzymatic decomposition products of gelatin can be also employed.

In the formation of silver halide grains in the silver halide emulsion, ammonia, an organic thioether derivative (see: Japanese Patent Publication No. 47(1972)-386) or sulfur-containing compound (see: Japanese Patent Provisional Publication No. 53(1978)-144319) can be used as a silver halide solvent. Further, in the grain formation or physical ripening, a cadmium salt, a zinc salt, a lead salt, a thallium salt, or the like can be introduced into the reaction system. Furthermore, for the purpose of improving high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. For the chemical sensitization of the emulsion employable for the light-sensitive material, there can be employed sulfur sensitization, reduction sensitization or noble metal sensitization, etc., singly or in combination. Those chemical sensitization processes can be carried out in the presence of a nitrogen-containing heterocyclic compound as described in Japanese Patent Provisional Publications Nos. 58(1983)-126526 and 58(1983)-215644.

When a sensitizing dye is added to the silver halide emulsion, the sensitizing dye is preferably added during the stage of preparation of the emulsion as described in the above-mentioned Japanese Patent Provisional Publication No. 62(1987)-947 and Japanese Patent Application No. 61(1986)-55510. When the nitrogen-containing heterocyclic compound functioning as an antifogging agent and/or a development accelerator is added to the silver halide emulsion, the compound is preferably added during the stage of the formation or ripening of the silver halide grains. The process for the preparation of the light-sensitive material employing the nitrogen-containing heterocyclic compound is described in Japanese Patent Provisional Publication No. 62(1987)-161144.

When the organic silver salt is contained in the light-sensitive layer, the emulsion of the organic silver salt can be prepared in the similar manner to that in the preparation of the silver halide emulsion.

In the preparation of the light-sensitive material, the polymerizable compound can be used as a medium for the preparation of a liquid composition containing other components of the light-sensitive layer. For example, the silver halide (including silver halide emulsion), reducing agent, color forming substance, and the like can be dissolved or emulsified in the polymerizable compound. Especially when the color forming substance is used, the substance is preferably introduced into the polymerizable compound. Further, when the oily droplets of the polymerizable compound are made in the form of microcapsules, components of the shell material may be contained in the polymerizable compound.

A light-sensitive composition containing the polymerizable compound which contains the silver halide can be prepared using the silver halide emulsion. Otherwise, a silver halide powder prepared by lyophylization can be also used other than the silver halide emulsion to prepare the light-sensitive composition. The light-sensitive composition can be obtained by stirring the polymerizable compound and the silver halide using a homogenizer, a blender, a mixer or other conventional stirring device.

A copolymer consisting of hydrophilic repeating unit and hydrophobic repeating unit is preferably dissolved in the polymerizable compound employed in the preparation of the light-sensitive composition, as described in Japanese Patent Provisional Publication No. 62(1987)-209449.

The light-sensitive composition can be also prepared by dispersing microcapsules containing silver halide emulsion as a core material in the polymerizable compound instead of employing the above copolymer, as described in Japanese Patent Provisional Publication No. 62(1987)-164041.

The polymerizable compound or the above-mentioned light-sensitive composition which further contains other components is preferably employed in the form of an emulsion in which the compound or the composition is emulsified in an aqueous medium. In the case of preparing microcapsules of oily droplets containing the polymerizable compound, it is possible that the shell material required for the preparation of microcapsules is added to the emulsion and the emulsion is then subjected to a process for forming a shell of microcapsule. Otherwise, to the emulsion may be also added a reducing agent or other optional components.

Examples of the processes for preparing microcapsules include a process utilizing coacervation of a hydrophilic shell material as described in U.S. Pat. Nos. 2,800,457 and 2,800,458; an interface polymerization process as described in U.S. Pat. No. 3,287,154, British Patent No. 990,443, and Japanese Patent Publication Nos. 38(1963)-19574, 42(1967)-446 and 42(1967)-771; a polymer deposition process as described in U.S. Pat. Nos. 3,418,250 and 3,660,304; a process using an isocyanatepolyol shell material as described in U.S. Pat. No. 3,796,669; a process using an isocyanate shell material as described in U.S. Pat. No. 3,914,511; a process using urea-formaldehyde or urea-formaldehyde-resorcinol shell material as described in U.S. Pat. No. 4,001,140, 4,087,376 and 4,089,802; a process using a shell material such as a melamin-formaldehyde resin or hydroxypropylcellulose as described in U.S. Pat. No. 4,025,455; an in-situ process utilizing polymerization of monomers as described in Japanese Patent Publication No. 36(1961)-9168 and Japanese Patent Provisional Publication No. 51(1976)-9079; a polymerization-dispersion cooling process as described in British Patent Nos. 927,807 and 965,074; and a spray-drying process as described in U.S. Pat. No. 3,111,407; and British Patent No. 930,422. The process for preparing microcapsules of oily droplets of the polymerizable compound is by no means restricted to the above-mentioned processes, but most preferred is a process comprising emulsifying a core material and then forming a polymer film as a shell of the microcapsule around the core material.

When the polymerizable compound is a light-sensitive composition containing the silver halide, the obtained emulsion of the polymerizable compound (including microcapsule dispersion obtained by the above-mentioned process) can be employed per se as a coating solution for the formation of a light-sensitive material. When the light-sensitive composition does not contain the silver halide, the obtained emulsion can be mixed with other emulsions such as a silver halide emulsion and an emulsion containing other optional component (e.g., organic silver salt) to prepare a coating solution. Other optional components can be also added to the coating solution.

The coating solution prepared as above is coated over a support, and the coated layer of the solution is dried to prepare a light-sensitive material. Coating of the solution over the support can be readily performed by known processes.

The image-receiving material is described below. The image-forming method using an image-receiving material or an image-receiving layer is described in Japanese Patent Provisional Publication No. 61(1986)-278849.

As the support of the image-receiving material, there can be employed a baryta paper in addition to various materials employable as the support of the light-sensitive material. In the case that a porous material such as paper is employed as the support of the image-receiving material, the porous support preferably has a certain smoothness as described in Japanese Patent Provisional Publication No. 62(1987)-200530. An image-receiving material employing a transparent support is described in Japanese Patent Provisional Publication No. 62(1987)-209531.

The image-receiving material is usually prepared by providing an image-receiving layer on the support. The image-receiving layer can be constructed using a variety of compounds according to the color formation system. In the cases that a polymer image is formed on the image-receiving material and that a dye or pigment is employed as the color image forming substance, the image-receiving material can be composed of the support only.

For example, when a color formation system using a color former and a developer is employed, the developer can be contained in the image-receiving layer. Further, the image-receiving layer can be composed of at least one layer containing a mordant. The mordant can be selected from various compounds which are known in the art of the conventional photography in consideration of the kind of the color image forming substance. If desired, the image-receiving layer can be composed of two or more layers containing a plurality of mordants different from each other in the mordanting power.

The image-receiving layer preferably contains a polymer as a binder. The binder which is employable for the aforementioned light-sensitive layer can be also used for the image-receiving layer. Further, a polymer having a lower transmission coefficient of oxygen can be used as the binder, as described in Japanese Patent Provisional Publication No. 62(1987)-209454.

The image-receiving layer can contain a thermoplastic compound. In the case that the thermoplastic compound is contained in the image-receiving layer, the image-receiving layer itself is preferably composed of an agglomerate of fine particles of the thermoplastic compound (i.e., granulated thermoplastic compound). The image-receiving layer having the above constitute has such advantages that the formation of a transferred image can be readily done and a glossy image can be obtained under heating after the image formation.

The image-receiving material having an image-receiving layer containing the granulated thermoplastic compound is described in Japanese Patent Applications Nos. 61(1986)-124952 and 61(1986)-124953.

A photopolymerization initiator or a thermal polymerization initiator may be contained in the image-receiving layer as described in Japanese Patent Provisional Publication Nos 62(1987)-161149 and 62(1987)-210444.

The image-receiving layer can be composed of two or more layers according to the above-mentioned functions. The thickness of the image-receiving layer preferably ranges from 1 to 100 pm, more preferably from 1 to 20 μm.

A protective layer can be provided on the surface of the image-receiving layer. A layer composed of an agglomerate of granulated thermoplastic compound can be also provided on the surface of the image-receiving layer as described in Japanese Patent Provisional Publication No. 62(1987)-210460.

The present invention is further described by the following examples without limiting the invention.

EXAMPLE 1

Preparation of silver halide emulsion

In 1,200 ml of water were dissolved 24 g of gelatin and 1.2 g of sodium chloride, and the resulting gelatin solution was adjusted to pH 3.2 using 1N-sulfuric acid and kept at 60° C. To the gelatin solution, 600 ml of an aqueous solution containing 117 g of potassium bromide and 600 ml of an aqueous solution containing 0.74 mole of silver nitrate were added simultaneously at the same feed rate over 15 minutes under stirring of the gelatin solution. After 1 minute, to the resulting mixture was added 47 cc of a 1% methanol solution of the following sensitizing dye.

(Sensitizing dye)

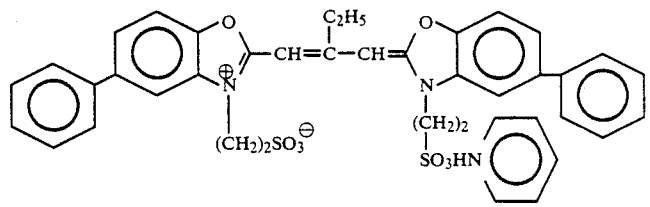

After 15 minutes, to the resulting mixture was added 200 ml of an aqueous solution containing 4.3 g of potassium iodide at the same feed rate over 5 minutes. To the resulting emulsion was added 1.2 g of isobutylene/-monosodium maleate copolymer to perform precipitation, and the emulsion was washed with water for desalting. Then, to the emulsion was successively added 24 g of gelatin and 5 mg of sodium thiosulfate to perform chemical sensitization at 60° C. for 15 minutes to obtain a silver halide emulsion. The yield of the emulsion was 1,000 g.

Preparation of light-sensitive composition

In 100 g of trimethylolpropane triacrylate (Aronix M-309 of Toa Synthetic Chemical Co., Ltd.) were dissolved 0.40 g of the following copolymer and 10 g of Pargascript Red I-6-B (tradename of Ciba-Geigy).

(Copolymer)

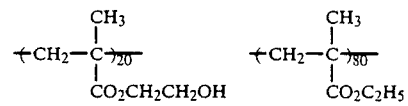

To 18.0 g of the resulting solution were added 1.29 g of the following hydrazine derivative (reducing agent), 1.22 g of the following developing agent (reducing agent), 0.018 g of the following compound (5) according to the invention, 0.36 g of Emalex NP-8 (trade name of Nippon Emulsion Co., Ltd.), 0.003 g of the following mercapto compound and 4 g of methylene chloride, to give a homogeneous solution.

(Hydrazine derivative)

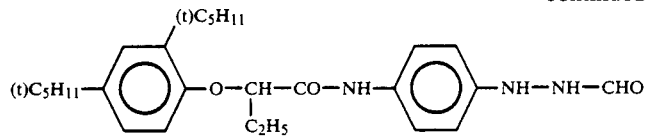

(Developing agent)

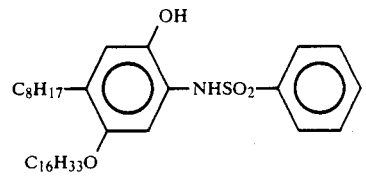

(Mercapto compound)

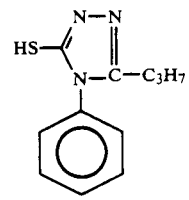

(Compound (5))

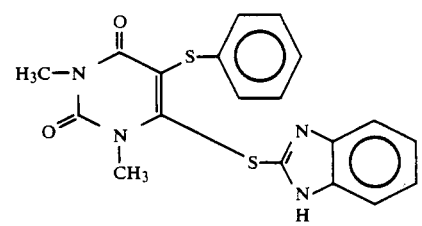

Indepdendently, to 3.00 g of the above-obtained silver halide emulsion was added 0.46 g of a 10% aqueous solution of potassium bromide, and the resulting mixture was stirred for 5 minutes. To the mixture containing the silver halide emulsion was added the above-obtained homogeneous solution, and the mixture was stirred at 15,000 r.p.m. for 5 minutes using a homogenizer to obtain a light-sensitive composition composed of a W/O emulsion.

Preparation of light-sensitive microcapsule dispersion

A 10% aqueous solution of sodium salt of polyvinylbenzene sulfonic acid (trade name: VERSA TL 500, available from National Starch, Co.) was adjusted to pH 3.5 using a 20% aqueous solution of phosphoric acid. Separately, to the above-prepared W/O emulsion was added 0.90 g of Takenate D110N (polyisocyanate compound, available from Takeda Chemical Industries, Ltd.). The resulting mixture was added to the above aqueous solution, and the resulting mixture was then heated to 40° C. and stirred at 7,000 r.p.m. for 30 minutes using a homogenizer to obtain a W/O/W emulsion.

Independently, to 13.20 g of melamine were added 21.6 g of a 37% aqueous solution of formaldehyde and 70.8 g of distilled water, and the resulting mixture was stirred at 60° C. for SO minutes to give an aqueous solution of a transparent melamine-formaldehyde precondensate.

To 13.00 g of the aqueous solution of precondensate was added the above-obtained W/O/W emulsion. The resulting mixture was then adjusted to pH 6.0 using a 20% aqueous solution of phosphoric acid, and then the mixture was stirred for 90 minutes at 60° C. Further, to the mixture was added 5.4 g of a 40% aqueous solution of urea to remove the remaining formaldehyde, and then the mixture was adjusted to pH 3.5 using a 20% aqueous solution of phosphoric acid and stirred for 40 minutes. Thereafter, the mixture was adjusted to pH 6.5 using an aqueous solution of 1N aqueous sodium hydroxide to obtain a dispersion of microcapsules having shells containing a melamine-formaldehyde resin.

Preparation of light-sensitive material (A)

To 2.50 g of the above-obtained microcapsule dispersion were added 0.33 g of a 5% aqueous solution of Emalex NP-8 (trade name of Nippon Emulsion Co., Ltd.), 0.58 g of a 20% dispersion of the following base precursor, 0.75 g of a 20% solution of sorbitol, 0.83g of a 20% aqueous dispersion of cornstarch and 3.19 g of distilled water, and the resulting mixture was sufficiently stirred to give a coating solution for the formation of a light-sensitive layer.

(Base precursor)

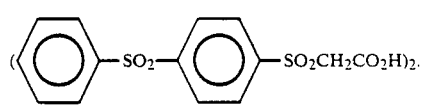

-continued

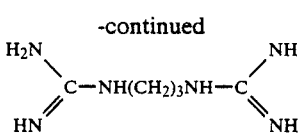

The coating solution was coated on a polyethylene terephthalate film having a thickness of 100 μm using a wire bar (#40), and the coated layer was dried at 40° C. for one hour to obtain a light-sensitive material (A).

COMPARISON EXAMPLE 1

Preparation of light-sensitive composition

The procedure for preparing a light-sensitive composition in Example 1 was repeated except for using 0.058 g of the following compound instead of the compound (5), to prepare a light-sensitive composition.

(Compound)

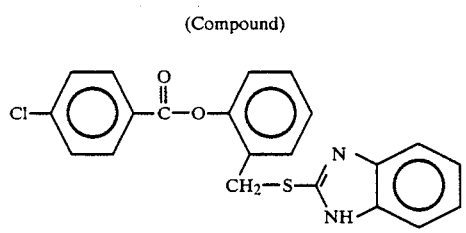

Preparation of light-sensitive material (B)

The procedures of Example 1 were repeated except for using the above-obtained light-sensitive composition, to prepare a light-sensitive material (B).

COMPARISON EXAMPLE 2

Preparation of light-sensitive composition

The procedure for preparing a light-sensitive composition in Example 1 was repeated except for not using the compound (5), to prepare a light-sensitive composition.

Preparation of light-sensitive material (C)

The procedures of Example 1 were repeated except for using the above-obtained light-sensitive composition, to prepare a light-sensitive material (C).

Preparation of Image-receiving Material

To 125 g of water was added 11 g of a 40% aqueous solution of sodium hexametaphosphate, and to the mixture were further added 34 g of zinc 3,5-di-α-methylbenzylsalicylate and 82 g of a 55% slurry of calcium carbonate, followed by coarsely dispersing in a mixer. The resulting coarse dispersion was then finely dispersed in Dynomill dispersing device. To 200 g of the resulting dispersion were added 6 g of a 50% latex of SBR and 55 g of an 8% aqueous solution of polyvinyl alcohol, and the resulting mixture wad made uniform. The mixture was then evenly coated on a barytapaper having basis weight of 43 g/m² to give a layer having a wet thickness of 30 μm, and the coated layer was dried to obtain an image-receiving material.

Image-formation and Evaluation Thereof

Images were formed using the light-sensitive materials (A), (B) and (C) obtained as above according to the following image-forming method, and the resulting images were evaluated on the density by the following tests.

(1) Each of the light-sensitive materials was imagewise exposed to light using a tungsten lamp at 2,000 lux for 1 second, and then heated on a hot plate at 150° C. for 10 seconds. Each of the exposed and heated light-sensitive materials was then combined with the above-obtained image-receiving material, and they were applied with pressure of 500 kg/cm² using a press roller to obtain a magenta positive image on the image-receiving material. The maximum density (D max) and the minimum density (D min) of the obtained magenta positive image were measured using Macbeth densitometer (2) The storage properties (preservability) of the light-sensitive materials were evaluated by storing each material for 7 days in a sealed container (temperature: 50° C., humidity: 20 %RH) and then measuring the image density in the same manner as described in the above-described test (1).

(3) The procedure of the test (1) was repeated except for varying the heat-developing temperature to 155° C. to evaluate the obtained image.

The results are set forth in Table 1.

TABLE 1

| | Image Density | | | | | |
|---|---|---|---|---|---|---|
| | (Before Storage) (Temp.: 150° C.) | | (After Storage) (Temp.: 150° C.) | | (Before Storage) (Temp.: 155° C.) | |
| | D max | D min | D max | D min | D max | D min |
| Light-sensitive Material | | | | | | |
| (A) | 1.20 | 0.09 | 1.21 | 0.09 | 1.18 | 0.09 |
| (B) | 1.20 | 0.08 | 1.21 | 0.25 | 1.21 | 0.07 |
| (C) | 1.20 | 0.08 | 0.90 | 0.08 | 0.90 | 0.08 |

As is evident from the results set forth in Table 1, the image-forming method of the present invention using the light-sensitive material (A) was hardly influenced by variation of heating temperature. Further, the decrease of D max of the resulting image caused by excessive development when the material was heated at high temperatures is relatively low. In other words, when the development inhibitor precursor of the present invention was employed in the image-forming method, an image of improved sharpness and high contrast could be obtained at developing temperatures of a wide range.

Further, an image of improved sharpness and high contrast was also obtained even after storage under severe conditions. In more detail, the increase of D min was less, as compared with the case of using a known compound. Furthermore, the decrease of Dmax was less as compared with the case of not using the compound of the present invention. The same effect was obtained also in the case in which the compound (1), (3) or (21) was employed.

EXAMPLE 2

Preparation of silver halide emulsion (D-1) (blue-sensitive)

In 1,500 ml of water were dissolved 16 g of gelatin and 0.5 g of sodium chloride, and the resulting gelatin solution was adjusted to pH 3.2 using 1N-sulfuric acid and kept at 50° C. To the gelatin solution, 300 ml of an aqueous solution containing 71 g of potassium bromide and 300 ml of an aqueous solution containing 0.59 mole of silver nitrate were added simultaneously at the same feed rate over 50 minutes. After 1 minute, to the resulting mixture was added 43 ml of a 1% methanol solution of the following sensitizing dye (1).

(Sensitizing dye (1))

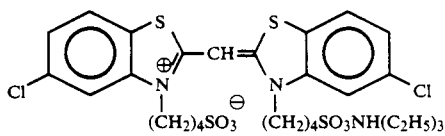

After 15 minutes, to the resulting mixture were added 100 ml of an aqueous solution containing 2.9 g of potassium iodide and 100 ml of an aqueous solution containing 0.018 mole of silver nitrate at the same feed rate over 5 minutes. To the resulting emulsion was added 1.2 g of isobutylene/monosodium maleate copolymer to perform precipitation, and the emulsion was washed with water for desalting. Then, to the emulsion was successively added 12 g of gelatin and 0.5 mg of sodium thiosulfate to perform chemical sensitization for 15 minutes, to obtain a silver iodobromide monodisperse emulsion (D-1) containing 14-hedral silver iodobromide grains having an average grain size of 0.22 μm. The yield of the emulsion was 1,000 g.

Preparation of silver halide emulsion (D-2)
(green-sensitive)

In 1,000 ml of water were dissolved 20 g of gelatin and 0.5 g of sodium chloride, and the resulting gelatin solution was adjusted to pH 3.2 using 1N-sulfuric acid and kept at 42° C. To the gelatin solution, 200 ml of an aqueous solution containing 71 g of potassium bromide and 200 ml of an aqueous solution containing 0.59 mole of silver nitrate were added simultaneously at the same feed rate over 30 minutes. After 1 minute, to the resulting mixture was added 48B ml of a 1% methanol solution of the following sensitizing dye (2).

(Sensitizing dye (2))

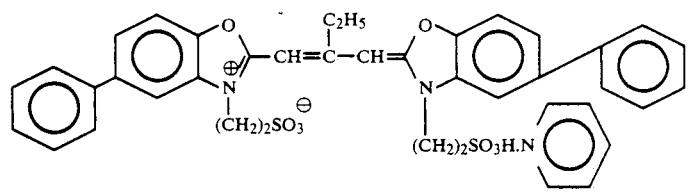

After 10 minutes, to the resulting mixture were added 100 ml of an aqueous solution containing 2.9 g of potassium iodide and 100 ml of an aqueous solution containing 0.018 mole of silver nitrate at the same feed rate over 5 minutes. To the resulting emulsion was added 1.2 g of poly(isobutylene-co-maleic acid monosodium) to perform precipitation, and the emulsion was washed with water for desalting. Then, to the emulsion was successively added 18 g of gelatin and 0.7 mg of sodium thiosulfate to perform chemical sensitization at 60° C. for 15 minutes, to obtain a silver iodobromide monodisperse emulsion (D-2) containing 14-hedral silver iodobromide grains having an average grain size of 0.12 μm. The yield of the emulsion was 1,000 g.

Preparation of silver halide emulsion (D-3)
(red-sensitive)

In 1,600 ml of water were dissolved 20 g of gelatin and 0.5 g of sodium chloride, and the resulting gelatin solution was adjusted to pH 3.5 using 1N-sulfuric acid and kept at 45° C. To the gelatin solution, 200 ml of an aqueous solution containing 71i g of potassium bromide and 200 ml of an aqueous solution containing 0.59 mole of silver nitrate were added simultaneously at the same feed rate over 30 minutes. After 1 minute, to the resulting mixture was added 48 ml of a 1% methanol solution of the following sensitizing dye (3).

(Sensitizing dye (3))

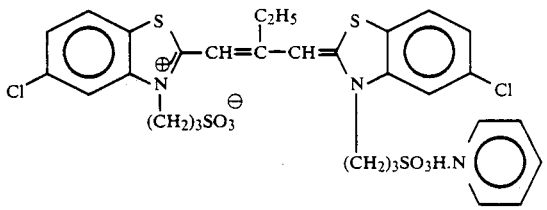

After 15 minutes, to the resulting mixture were added 100 ml of an aqueous solution containing 3.60 g of potassium iodide and 100 ml of an aqueous solution containing 0.022 mole of silver nitrate at the same feed rate over 5 minutes. To the resulting emulsion was added 1.2 g of isobutylene/monosodium maleate copolymer to perform precipitation, and the emulsion was washed with water for desalting. Then, to the emulsion was successively added 10 g of gelatin and 0.45 mg of sodium thiosulfate to perform chemical sensitization at 55° C. for 20 minutes, to obtain a silver iodobromide monodisperse emulsion (D-3) containing 14-hedral silver iodobromide grains having an average grain size of 0.13 μm. The yield of the emulsion was 1,000 g.

Preparation of light-sensitive composition (D-1)
(blue-sensitive)

In 83 g of trimethylolpropane triacrylate (Aronix M-3.09 of Toa Synthetic Chemical Co., Ltd.) were dissolved 0.77 g of the following copolymer and 12.5 g of the following yellow image forming substance.

(Copolymer)

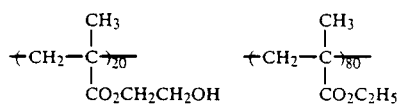

(Yellow image forming substance)

-continued

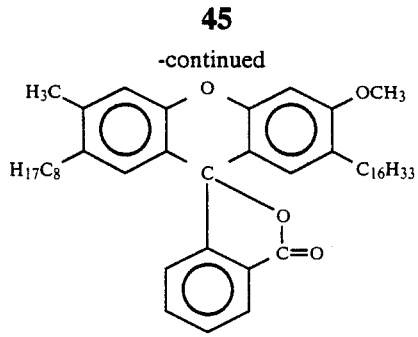

To the resulting solution were added 6.4 g of the following reducing agent (1) (hydrazine derivative), 6.1 g of the following reducing agent (2), 0.09 g of the development inhibitor precursor (5) used in Example 1, 0.01 g of the following mercapto compound, 1.8 g of a surface active agent (Emalex NP-3 of Nippon Emulsion Co., Ltd.) and 20 g of methylene chloride, to give a homogeneous oily solution.

(Reducing agent (1))

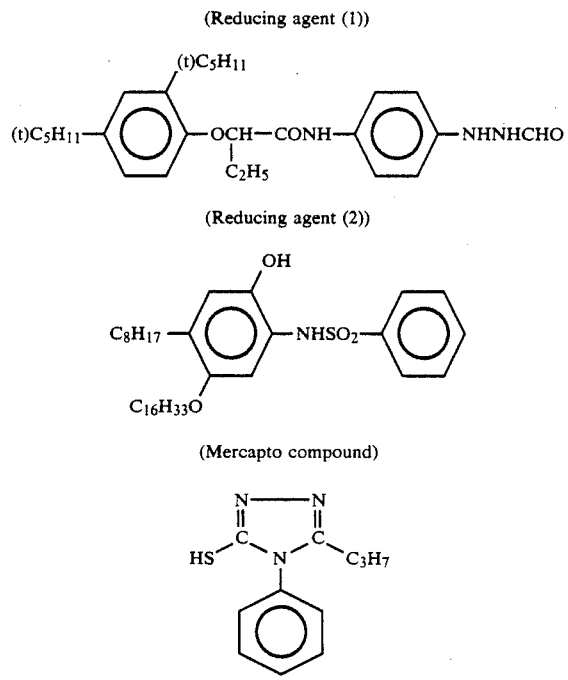

(Reducing agent (2))

(Mercapto compound)

Independently, to 15 g of the above-obtained silver halide emulsion (D-1) was added 1.5 ml of a 10% aqueous solution of potassium bromide, and the resulting mixture was stirred for 5 minutes. To the mixture containing the silver halide emulsion was added the above-obtained homogeneous solution and the mixture was stirred at 15,000 r.p.m. for 5 minutes using a homogenizer to obtain a light-sensitive composition (D-1) composed of a W/O emulsion.

Preparation of light-sensitive composition (D-2) (green-sensitive)

The procedures for preparing a light-sensitive composition (D-1) described above were repeated except for using the above-obtained silver halide emulsion (D-2) instead of the silver halide emulsion (D-1) in the same amount, 20 g of the following magenta image forming substance instead of the yellow image forming substance and 0.015 g of the above-mentioned mercapto compound, to prepare a light-sensitive composition (D-2).

(Magenta image forming substance)

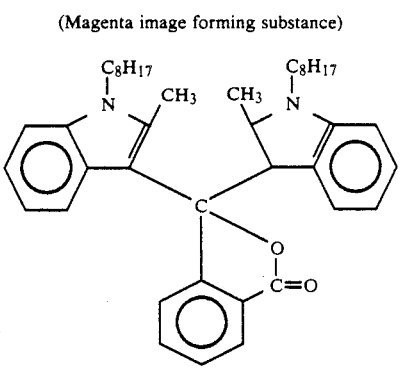

Preparation of light-sensitive composition (D-3) (red-sensitive)

The procedures for preparing a light-sensitive composition (D-1) described above were repeated except for using the above-obtained silver halide emulsion (D-3) instead of the silver halide emulsion (D-1) in the same amount, 16 g of the following cyan image forming substance instead of the yellow image forming substance and 0.0075 g of the above-mentioned mercapto compound, to prepare a light-sensitive composition (D-3).

(Cyan image forming substance)

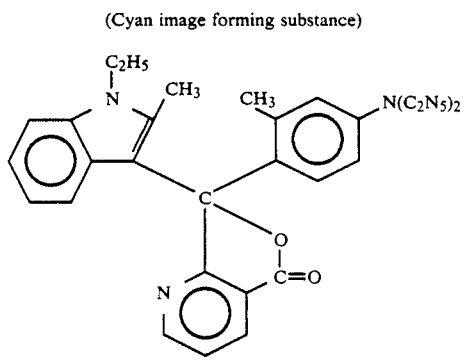

Preparation of light-sensitive microcapsule dispersion (D-1) (blue-sensitive)

In the above-obtained light-sensitive composition (D-1) was dissolved 4.5 g of an isocyanate compound (Takenate D110N of Takeda Chemical Industries, Ltd.). To the resulting solution was added 210 g of a 10% aqueous solution of sodium salt of polyvinylbenzene sulfonic acid (trade name: VERSA TL-502, available from National Starch, Co.) having been adjusted to pH 6.0 using a 10% aqueous solution of sodium hydroxide. The resulting mixture was heated to 40° C. and stirred at 9,000 r.p.m. for 30 minutes using a homogenizer to obtain a W/O/W emulsion.

Independently, to 13.20 g of melamine were added 21.6 g of a 37% aqueous solution of formaldehyde and 70.0 g of distilled water, and the resulting mixture was stirred at 60° C. for 50 minutes to give an aqueous solution of a transparent melamine-formaldehyde precondensate.

To 77.0 g of the aqueous solution of precondensate was added the above-obtained W/O/W emulsion. The resulting mixture was then adjusted to pH 6.0 using a 20% aqueous solution of phosphoric acid, and then the mixture was stirred for 120 minutes at 60° C. Further, to the mixture was added 27.0 g of a 40% aqueous solution of urea and then adjusted to pH 3.5 using a 20% aqueous solution of phosphoric acid. The obtained dispersion was then stirred at 1,000 r.p.m. for 40 minutes at 60° C. Finally, the dispersion was adjusted to pH 6.5 and cooled to room temperature, to obtain a light-sensitive microcapsule dispersion (D-1).

Preparation of light-sensitive microcapsule dispersion (D-2) (green-sensitive)

The procedures for preparing the light-sensitive microcapsule dispersion (D-1) were repeated except for using the light-sensitive composition (D-2) instead of the light-sensitive composition (D-1), to prepare a light-sensitive microcapsule dispersion (D-2).

Preparation of light-sensitive microcapsule dispersion (D-3) (red-sensitive)

The procedures for preparing the light-sensitive microcapsule dispersion (D-1) were repeated except for using the light-sensitive composition (D-3) instead of the light-sensitive composition (D-1), to prepare a light-sensitive microcapsule dispersion (D-3).

Preparation of light-sensitive material (D)

To 17.0 g of each of the above-obtained microcapsule dispersions (D-1), (D-2) and (D-3) were added 5 g of a 10% aqueous solution of gelatin, 6 ml of a 5% aqueous solution of surface active agent (Emalex NP-8 of Nippon Emulsion Co., Ltd.), 7.3 g of a 10% aqueous dispersion of zinc hydroxide and 28.0 g of water, 5 ml of a 2% aqueous solution of 1,2-bis(vinylsulfonylacetamide)ethane to give coating solutions for the formation of a light-sensitive layer.

Each of the coating solutions was coated over polyethylene terephthalate (support) of 100 μm thick to give a coated layer having a wet thickness of 50 μm, and the coated layer was dried to prepare light-sensitive materials (D).

COMPARISON EXAMPLE 3

Preparation of light-sensitive material (E)

The procedures for preparing light-sensitive compositions (D-1), (D-2) and (D-S) in Example 2 were repeated except for using the following compound (a) instead of the development inhibitor precursor (5) to prepare light-sensitive compositions (E-1), (E-2) and (E-3) instead of the light-sensitive compositions (D-1), (D-2) and (D-3), light-sensitive materials (E) were prepared in the same manner as described in Example 2.

(Compond (a))

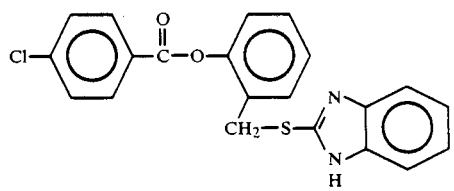

COMPARISON EXAMPLE 4

Preparation of light-sensitive material (F)

The procedures for preparing light-sensitive compositions (D-1), (D-2) and (D-3) in Example 2 were repeated except for not using the development inhibitor precursor (5) to prepare light-sensitive compositions (F-1), (F-2) and (F-3). Using the obtained light-sensitive compositions (F-1), (F-2) and (F-3) instead of the light-sensitive compositions (D-1), (D-2) and (D-3), light-sensitive materials (F) were prepared in the same manner as described in Example 2.

Image-formation and Evaluation Thereof

Images were formed using the above-prepared light-sensitive materials (D), (E) and (F) according to the following image-forming method of the invention, and the resulting images were evaluated on the density by the following tests.

Preparation of base-generating sheet 27 g of a 10% aqueous solution of gelatin, 3.2 g of a picolinic acid-guanidine salt, 17 ml of a 5% aqueous solution of dextran, 5 ml of a 5% aqueous solution of surface active agent used in Example 1, 2 ml of a 2% aqueous solution of 1,2-(bissulfonylacetamide) and 45 ml of water were mixed with each other to give a mixture. The mixture was coated over a polyethylene terephthalate sheet of 100 μm thick to give a coated layer of 70 μm thick (in wet state) on the sheet, and the coated layer was dried at approx. 40° C. to prepare a base-generating sheet.

(1) Each of the light-sensitive materials was imagewise exposed to light using a halogen lamp at 2,000 lux for one second through a continuous gray filter having a transmission of 0 to 3.0. On the light-sensitive layer of the light-sensitive material was coated water in an amount of 10 g/m². Then, thus treated light-sensitive layer of the light-sensitive material was brought into contact with the mixture-layer side surface of the above-obtained base-generating sheet. Keeping this state, the light-sensitive material with the base-generating sheet was heated at 95° C. for 15 seconds and at 90° C. for 15 seconds by means of a heating roller of belt-drive type Thereafter, the light-sensitive material was separated from the base-generating sheet, and the light-sensitive material was combined with the image-receiving material used in Example 1. The light-sensitive material with the image receiving material was passed through a press roller at a pressure of 500 kg/cm², to obtain positive color images (yellow (Y) image, magenta (M) image and cyan (C) image) on the image-receiving material. The maximum density and the minimum density of each of the obtained positive color images were measured by means of Macbeth reflection desitometer.

(2) The storage properties of each of the light-sensitive materials were evaluated by storing the light-sensitive material under the same storing conditions as those in Example 1 (i.e., storage for 7 days in a sealed container at 50° C. and 20%RH) and performing the same image-forming process as described above (heating temperature of heating roller: 90° C., heating time thereof: 15 seconds).

The results are set forth in Table 2.

TABLE 2

| | Image Density | | | | | |
|---|---|---|---|---|---|---|
| | (Before Storage) (95° C., 15 sec.) | | (Before Storage) (90° C., 15 sec.) | | (After Storage) (90° C., 15 sec.) | |
| | D max | D min | D max | D min | D max | D min |
| Light-sensitive Material (Color) | | | | | | |
| D (Y) | 1.10 | 0.10 | 1.11 | 0.11 | 1.11 | 0.13 |
| D (M) | 1.12 | 0.08 | 1.14 | 0.09 | 1.15 | 0.10 |
| D (C) | 1.05 | 0.09 | 1.08 | 0.09 | 1.09 | 0.10 |
| Light-sensitive Material (Color) | | | | | | |
| E (Y) | 1.11 | 0.11 | 1.13 | 0.12 | 1.13 | 0.28 |
| E (M) | 1.11 | 0.09 | 1.12 | 0.10 | 1.14 | 0.25 |
| E (C) | 1.08 | 0.08 | 1.09 | 0.09 | 1.10 | 0.20 |
| Light-sensitive Material (Color) | | | | | | |
| F (Y) | 0.75 | 0.10 | 0.98 | 0.11 | 0.94 | 0.12 |
| F (M) | 0.72 | 0.09 | 1.00 | 0.10 | 0.93 | 0.10 |
| F (C) | 0.70 | 0.08 | 0.99 | 0.10 | 0.93 | 0.11 |

As is evident from the results set forth in Table 2, the image-forming method of the invention in which a light-sensitive material containing the development inhibitor precursor was employed and a liquid (water in this case) was employed in the heat-developing procedure was hardly influenced by variation of heating temperatures, and gave an image of improved sharpness and high contrast at developing temperature of wide range, same as the case of not employing a liquid in the heat-developing procedure.

When the development inhibitor precursor of the present invention was employed in the image-forming method, an image of improved sharpness and high contrast was obtained at developing temperatures of a wide range.

Further, an image of improved sharpness and high contrast was also obtained even after storage under severe conditions. The increase of D min was less as compared with the case of using a known compound. Furthermore, the decrease of Dmax was less as compared with the case of not using the compound of the invention. The same effect was obtained also in the case in which the compound (1), (2), (3S), (21) or (21) was employed.

We claim:

1. An image-forming method which comprises the steps of:

imagewise exposing to light a light-sensitive material comprising a support and a light-sensitive layer provided thereon which contains a silver halide, a reducing agent, an ethylenically unsaturated polymerizable compound, a base or base precursor and a development inhibitor precursor having the formula (I):

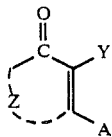

in which A is a development inhibitor bonded through a hetero atom or a group capable of releasing the development inhibitor by an elimination reaction and the subsequent reaction, Y is an optional atom or group, and Z is an atom group required for forming a carbon atom ring or a hetero ring, and heat-developing the light-sensitive material at a temperature in the range of 90° to 200° C. after or simultaneously with the above imagewise exposure to release the development inhibitor from the precursor and to imagewise polymerize said polymerizable compound.

2. The image-forming method as claimed in claim 1, wherein said development inhibitor precursor of the formula (I) is expressed by the formula (II):

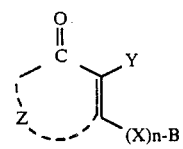

in which B is a development inhibitor bonded through a hetero atom; X is a divalent linkage group; n is 0 or 1; Y is at least one group selected from the group consisting of hydrogen, halogen, alkyl, alkenyl, aryl, alkoxy, aryloxy, acyloxy, carbonic acid ester, amino, carbonamide, ureido, carboxyl, oxycarbonyl, carbamoyl, acyl, sulfo, sulfonyl, sulfamoyl, alkylthio, arylthio, cyano and nitro, wherein said group may have one or more substituents; and Z is a group of carbon atoms required for forming a carbon atom ring or a hetero ring.

3. The image-forming method as claimed in claim 1, wherein said development inhibitor in the formula (I) is selected from the group consisting of mercaptobenzimidazoles, mercaptoimidazoles and mercaptothiadiazoles.

4. The image-forming method as claimed in claim 1, wherein said development inhibitor precursor having the formula (I) is contained in the light-sensitive layer in an amount of $10^{-8}$ to $10^{-1}$ mole per 1 mole of silver.

5. The image-forming method as claimed in claim 1, wherein said silver halide, reducing agent and polymerizable compound are contained in microcapsules dispersed in the light-sensitive layer.

6. The image-forming method as claimed in claim 1, wherein said light-sensitive layer further contains a color image-forming substance.

7. The image-forming method as claimed in claim 1, wherein the light-sensitive material having been subjected to the heat development is superposed on an image-receiving material and the unpolymerized polymerizable compound in the light-sensitive material is transferred under pressure to the image-receiving material.

* * * * *